(12) United States Patent
Shin et al.

(10) Patent No.: US 9,847,341 B2
(45) Date of Patent: Dec. 19, 2017

(54) THREE-DIMENSIONAL SEMICONDUCTOR MEMORY DEVICE

(71) Applicant: SAMSUNG ELECTRONICS CO., LTD., Suwon-si, Gyeonggi-do (KR)

(72) Inventors: Yoocheol Shin, Gyeonggi-do (KR); Hongsoo Kim, Gyeonggi-do (KR); Jaesung Sim, Gyeonggi-do (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 266 days.

(21) Appl. No.: 14/519,713

(22) Filed: Oct. 21, 2014

(65) Prior Publication Data

US 2015/0145015 A1 May 28, 2015

(30) Foreign Application Priority Data

Nov. 26, 2013 (KR) .................. 10-2013-0144650

(51) Int. Cl.
*H01L 27/115* (2017.01)
*H01L 27/11556* (2017.01)
(Continued)

(52) U.S. Cl.
CPC .... *H01L 27/11556* (2013.01); *G11C 16/0483* (2013.01); *H01L 27/11531* (2013.01);
(Continued)

(58) Field of Classification Search
CPC ........... H01L 27/11582; H01L 27/1157; H01L 27/11519; H01L 27/11551;
(Continued)

(56) References Cited

U.S. PATENT DOCUMENTS 7,821,058 B2 * 10/2010 Kidoh ............... H01L 27/11568
257/324
8,288,816 B2 * 10/2012 Komori ............... H01L 27/1157
257/324
(Continued)

FOREIGN PATENT DOCUMENTS

| KR | 10-2010-0003629 | 1/2010 |
| KR | 10-2011-0042526 | 4/2011 |
| KR | 10-2013-0019688 | 2/2013 |

*Primary Examiner* — Maliheh Malek
(74) *Attorney, Agent, or Firm* — F. Chau & Associates LLC

(57) ABSTRACT

A three-dimensional semiconductor memory device includes stacked structures, vertical semiconductor patterns, common source regions, and well pickup regions. The stacked structures are disposed on a semiconductor layer of a first conductivity type. Each stacked structure includes electrodes vertically stacked on each other and is extended in a first direction. The vertical semiconductor patterns penetrate the stacked structures. The common source regions of a second conductivity type are disposed in the semiconductor layer. At least one common source region is disposed between two adjacent stacked structures. The at least one common source region is extended in the first direction. The well pickup regions of the first conductivity type are disposed in the semiconductor layer. At least one well pickup region is adjacent to both ends of at least one stacked structure.

20 Claims, 30 Drawing Sheets

(51) Int. Cl.
  *H01L 27/11582* (2017.01)
  *G11C 16/04* (2006.01)
  *H01L 27/11531* (2017.01)
  *H01L 27/11548* (2017.01)
  *H01L 27/11573* (2017.01)
  *H01L 27/11575* (2017.01)
  *H01L 27/105* (2006.01)

(52) U.S. Cl.
  CPC .. *H01L 27/11548* (2013.01); *H01L 27/11573* (2013.01); *H01L 27/11575* (2013.01); *H01L 27/11582* (2013.01)

(58) Field of Classification Search
  CPC ........... H01L 27/11556; G11C 16/0408; G11C 16/0466; G11C 16/0483
  See application file for complete search history.

(56) References Cited

U.S. PATENT DOCUMENTS

| | | | | |
|---|---|---|---|---|
| 8,355,281 | B2* | 1/2013 | Grossi | H01L 27/0688 257/324 |
| 8,440,542 | B2* | 5/2013 | Sekar | H01L 21/8221 257/287 |
| 8,599,622 | B2* | 12/2013 | Kim | G11C 16/16 365/185.29 |
| 8,643,076 | B2* | 2/2014 | Seo | H01L 27/11573 257/315 |
| 8,704,293 | B2* | 4/2014 | Park | H01L 27/0207 257/329 |
| 9,166,012 | B2* | 10/2015 | Sim | H01L 29/42324 |
| 9,331,095 | B2* | 5/2016 | Shim | H01L 27/11582 |
| 9,379,123 | B2* | 6/2016 | Sim | H01L 29/42324 |
| 9,484,355 | B2* | 11/2016 | Jung | H01L 27/11575 |
| 9,515,087 | B2* | 12/2016 | Son | G11C 5/025 |
| 2007/0287287 | A1* | 12/2007 | Kang | H01L 21/31144 438/675 |
| 2008/0173928 | A1* | 7/2008 | Arai | H01L 29/7926 257/316 |
| 2009/0014718 | A1* | 1/2009 | Hong | H01L 22/14 257/48 |
| 2009/0268522 | A1* | 10/2009 | Maejima | G11C 5/02 365/185.11 |
| 2010/0002516 | A1* | 1/2010 | Sim | G11C 5/02 365/185.17 |
| 2011/0019486 | A1* | 1/2011 | Jang | G11C 16/0483 365/185.25 |
| 2011/0090737 | A1* | 4/2011 | Yoo | G11C 16/0483 365/185.11 |
| 2011/0115010 | A1* | 5/2011 | Shim | H01L 27/11565 257/314 |
| 2011/0310670 | A1* | 12/2011 | Shim | G11C 16/0408 365/185.17 |
| 2012/0070944 | A1* | 3/2012 | Kim | H01L 27/0688 438/128 |
| 2012/0108048 | A1* | 5/2012 | Lim | H01L 27/11529 438/586 |
| 2012/0168824 | A1* | 7/2012 | Lee | H01L 27/11582 257/204 |
| 2012/0168831 | A1* | 7/2012 | Ahn | H01L 27/11582 257/288 |
| 2012/0206979 | A1* | 8/2012 | Shin | H01L 27/11582 365/185.26 |
| 2012/0208347 | A1* | 8/2012 | Hwang | H01L 27/1157 438/430 |
| 2012/0257452 | A1* | 10/2012 | Kim | G11C 16/0483 365/185.11 |
| 2013/0126957 | A1* | 5/2013 | Higashitani | H01L 27/11519 257/314 |
| 2013/0127011 | A1* | 5/2013 | Higashitani | H01L 27/11575 257/532 |
| 2013/0187233 | A1* | 7/2013 | Yun | H01L 27/11519 257/368 |
| 2014/0151777 | A1* | 6/2014 | Sim | H01L 29/42324 257/315 |
| 2014/0217493 | A1* | 8/2014 | Fukuzumi | G11C 16/0483 257/324 |
| 2014/0307508 | A1* | 10/2014 | Rhie | G11C 16/0483 365/185.17 |
| 2015/0035065 | A1* | 2/2015 | Park | H01L 27/105 257/368 |
| 2015/0129977 | A1* | 5/2015 | Chen | H01L 27/0277 257/390 |
| 2015/0228663 | A1* | 8/2015 | Youn | H01L 27/11582 438/268 |
| 2015/0372004 | A1* | 12/2015 | Jung | H01L 27/11582 257/324 |
| 2015/0380421 | A1* | 12/2015 | Sim | H01L 29/42324 438/421 |
| 2016/0049422 | A1* | 2/2016 | Kim | H01L 27/11582 257/324 |
| 2016/0155751 | A1* | 6/2016 | Shin | H01L 27/11578 257/326 |
| 2016/0329340 | A1* | 11/2016 | Hwang | H01L 21/30604 |
| 2016/0343450 | A1* | 11/2016 | Lee | G11C 16/3459 |
| 2016/0365356 | A1* | 12/2016 | Jung | H01L 27/11575 |
| 2016/0372322 | A1* | 12/2016 | Oh | H01L 21/0274 |

* cited by examiner

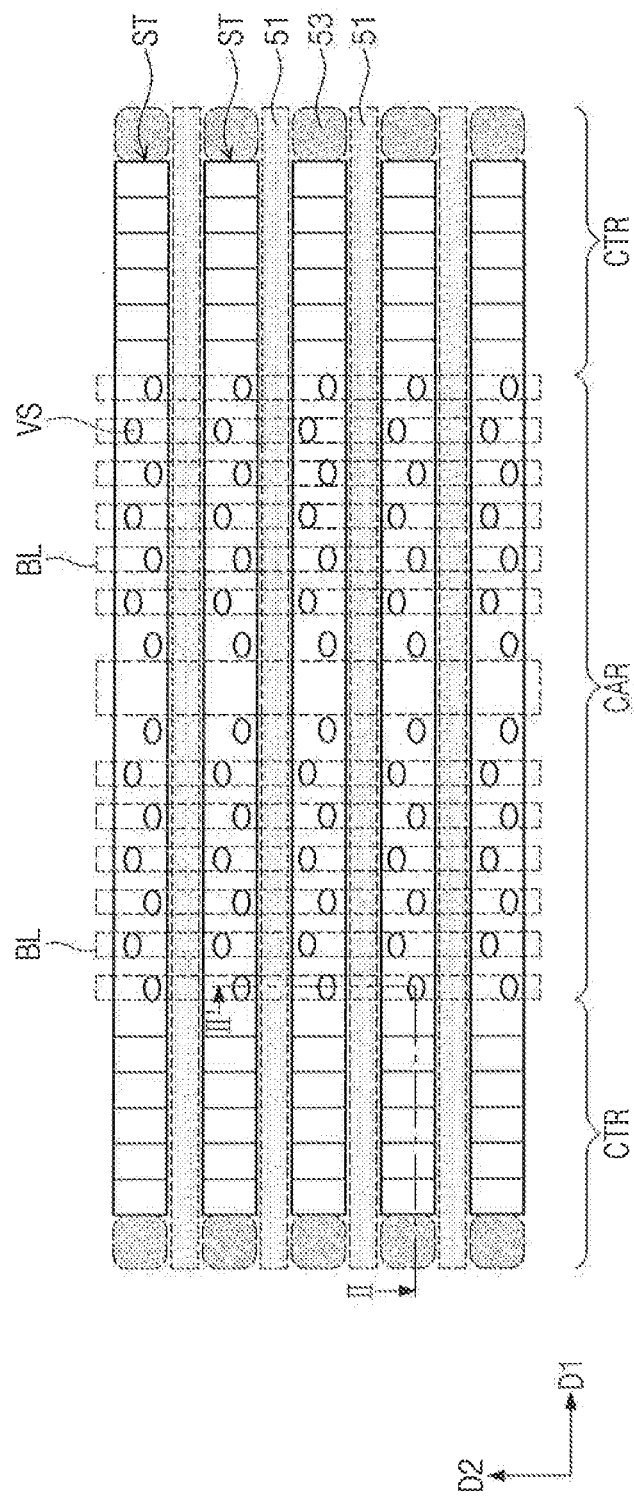

THREE-DIMENSIONAL SEMICONDUCTOR MEMORY DEVICE

CROSS-REFERENCE TO RELATED APPLICATION

This application claims priority under 35 U.S.C. §119 to Korean Patent Application No. 10-2013-0144650, filed on Nov. 26, 2013 in the Korean Intellectual Property Office, the disclosure of which is incorporated by reference herein in its entirety.

TECHNICAL FIELD

The inventive concept relates to a three-dimensional semiconductor memory device.

DISCUSSION OF RELATED ART

Three-dimensional semiconductor memory devices including memory cells have been proposed. To increase the integration density of the semiconductor memory devices, the memory cells are stacked on each other in a vertical direction. However, when memory cells are stacked in a vertical direction, it may be difficult to provide uniform operating characteristics.

SUMMARY

According to an exemplary embodiment of the present inventive concept, a three-dimensional semiconductor memory device includes stacked structures, vertical semiconductor patterns, common source regions, and well pickup regions. The stacked structures are disposed on a semiconductor layer of a first conductivity type. Each stacked structure includes electrodes vertically stacked on each other and is extended in a first direction. The vertical semiconductor patterns penetrate the stacked structures. The common source regions of a second conductivity type are disposed in the semiconductor layer. At least one common source region is disposed between two adjacent stacked structures. The at least one common source region is extended in the first direction. The well pickup regions of the first conductivity type are disposed in the semiconductor layer. At least one well pickup region is adjacent to both ends of at least one stacked structure.

According to an exemplary embodiment of the present inventive concept, a three-dimensional semiconductor memory device includes a cell array structure and well pickup regions. The cell array structure includes stacked structures, vertical structures, and common source regions. The stacked structures extend in parallel to each other on a semiconductor layer of a first conductivity type. The vertical structures penetrate the stacked structures. The common source regions of a second conductivity type are disposed in the semiconductor layer between the stacked structures, extending in parallel to the plurality of stacked structures. The well pickup regions of the first conductivity type are formed in the semiconductor layer around the cell array structure.

According to an exemplary embodiment of the present inventive concept, a three-dimensional semiconductor memory device includes a voltage generator, stacked structures, common source regions, and well pickup regions. The voltage generator generates an erase voltage. The stacked structures are disposed on a semiconductor layer of a first conductivity type. Each stacked structure, extended in a first direction, includes electrodes vertically stacked on each other. Common source regions of a second conductivity type are disposed in the semiconductor layer. A common source region, extended in the first direction, is disposed between two adjacent stacked structures. The well pickup regions of the first conductivity type are disposed in the semiconductor layer. At least two well pickup regions of the plurality of well pickup regions are adjacent to both ends of a stacked structure. The at least two well pickup regions are electrically connected to the voltage generator to receive the erase voltage during an erase operation.

BRIEF DESCRIPTION OF THE DRAWINGS

These and other features of the inventive concept will become more apparent by describing in detail exemplary embodiments thereof with reference to the accompanying drawings of which:

FIG. 8 is a top plan view of a cell region of a three-dimensional semiconductor memory device according to an exemplary embodiment of the inventive concept;

DETAILED DESCRIPTION OF EXEMPLARY EMBODIMENTS

Figure 1:
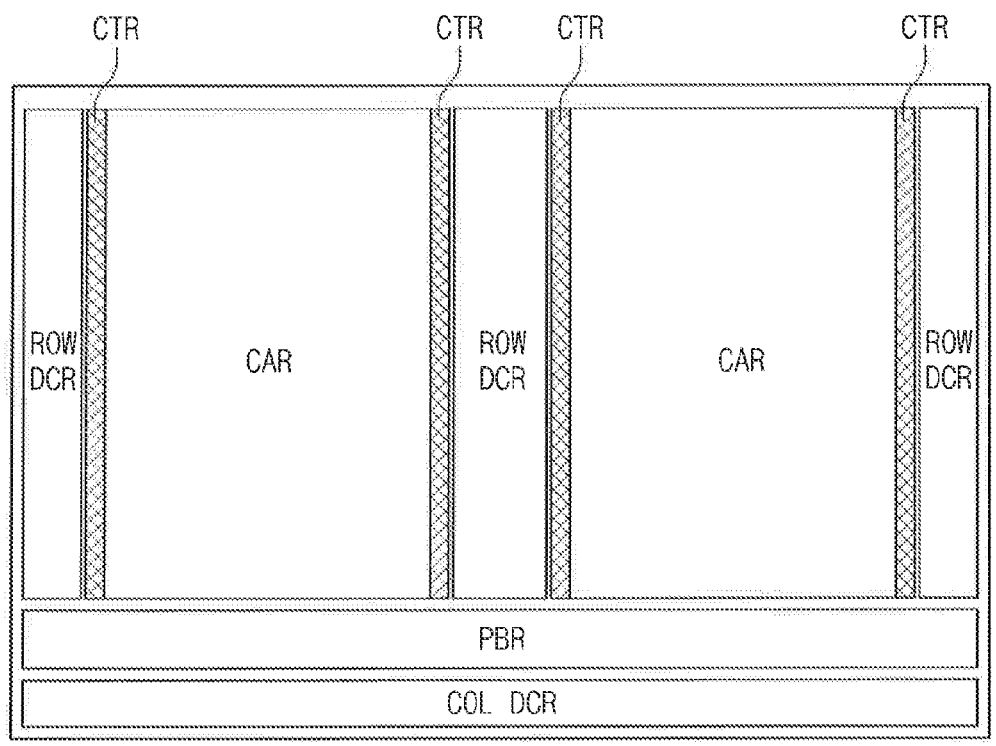
FIG. 1 illustrates a layout of a three-dimensional semiconductor memory device according to an exemplary embodiment of the inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Figure 2:
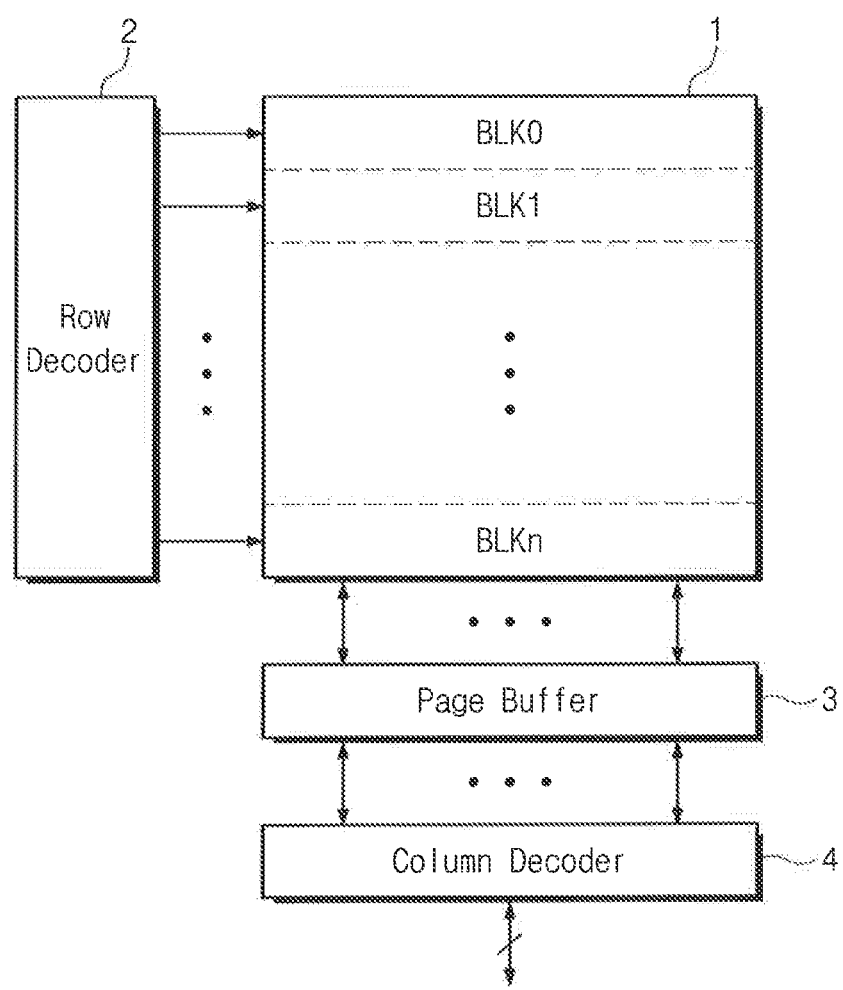
FIG. 2 is a block diagram of a three-dimensional semiconductor memory device according to an exemplary embodiment of the inventive concept.

FIG. 1 illustrates a layout of a three-dimensional semiconductor memory device according to an exemplary embodiment of the inventive concept, and FIG. 2 is a block diagram of a three-dimensional semiconductor memory device according to an exemplary embodiment of the inventive concept.

Referring to FIG. 1, a semiconductor memory device includes a cell array region CAR and a peripheral circuit region. The peripheral circuit region includes row decoder regions ROW DCR, a page buffer region PBR, and a column decoder region COL DCR. A contact region CTR is disposed between the cell array region CAR and the row decoder regions ROW DCR.

Referring to FIGS. 1 and 2, a memory cell array 1 including memory cells is disposed in the cell array region CAR. The memory cell array 1 includes memory cells, and word lines and bit lines which are electrically connected to the memory cells. The memory cell array 1 includes memory blocks BLK0~BLKn. Each of the memory blocks BLK0 to BLKn may correspond to a data erase unit. The memory cell array 1 will be described in detail later with reference to FIGS. 3 and 4.

A row decoder 2 may be disposed in the row decoder region ROW DCR and selects word lines of the memory cell array 1. An interconnection structure may be disposed in the contact region CTR to electrically connect the memory cell array 1 and the row decoder 2 to each other. The row decoder 2 selects one of the memory blocks BLK0~BLKn in the memory cell array 1 and selects one of word lines of the selected memory block according to address information. The row decoder 2 may provide a wordline voltage generated from a voltage generator circuit (not shown) to the selected wordline and unselected wordlines in response to control signals of a control circuit (not shown).

A page buffer 3 for reading data stored in the memory cells may be disposed in the page buffer region PBR. The page buffer 3 may temporarily store data that will be stored in the memory cells or may sense data stored in the memory cells according to an operation mode. For example, the page buffer 3 may be operated as a write driver circuit in a program operation mode and may be operated as a sense amplifier circuit in a read operation mode.

A column decoder 4 may be disposed in the column decoder region COL DCR and is electrically connected to the bit lines of the memory cell array 1. The column decoder 4 may provide a data transfer path between the page buffer 3 and an external device (e.g., memory controller).

Figure 3:
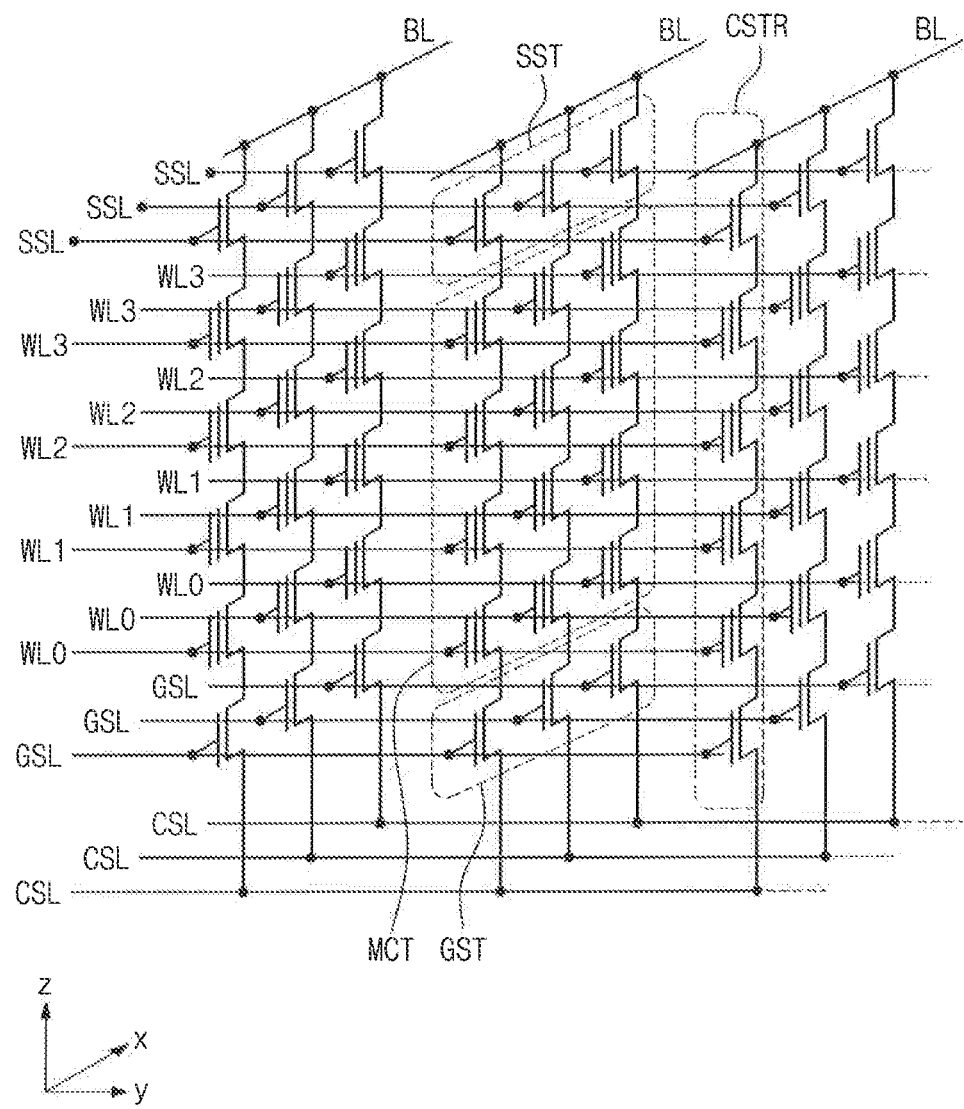
FIG. 3 is a circuit diagram of a cell array of a three-dimensional semiconductor memory device according to an exemplary embodiment of the inventive concept.

FIG. 3 is a circuit diagram of a cell array of a three-dimensional semiconductor memory device according to an exemplary embodiment of the inventive concept.

Referring to FIG. 3, a cell array of a semiconductor memory device according to an exemplary embodiment includes a common source line CSL, bit lines BL, and cell strings CSTR disposed between the common source line CSL and the bit lines BL.

The bit lines BL are two-dimensionally arranged. The cell strings CSTR are connected in parallel to each of the bit lines BL. The cell strings CSTR are commonly connected to the common source lines CSL. For example, the cell strings CSTR are arranged between bit lines BL and one common source line CSL. The common source lines CSL are provided in plural and two-dimensionally arranged. A voltage may be commonly applied to the common source lines CSL. Alternatively, a voltage may be independently applied to each of the common source lines CSL.

Each of the cell strings CSTR may include a ground selection transistor GST connected to a common source line CSL, a string selection transistor SST connected to the bit line BL, and memory cell transistors MCT disposed between ground and string selection transistors GST and SST. The ground selection transistor GST, the string selection transistor SST, and the memory cell transistors MCT may be connected in series to each other.

The common source line CSL may be commonly connected to sources of the ground selection transistors GST. Ground selection lines GSL, word lines WL0~WL3, and string selection lines SSL disposed between the common source lines CSL and the bit lines BL may serve as gate electrodes of ground selection transistors GST, memory cell transistors MCT, and string selection transistors SST, respectively. Each of the memory cell transistors MCT may include a data storage element.

Figure 4:
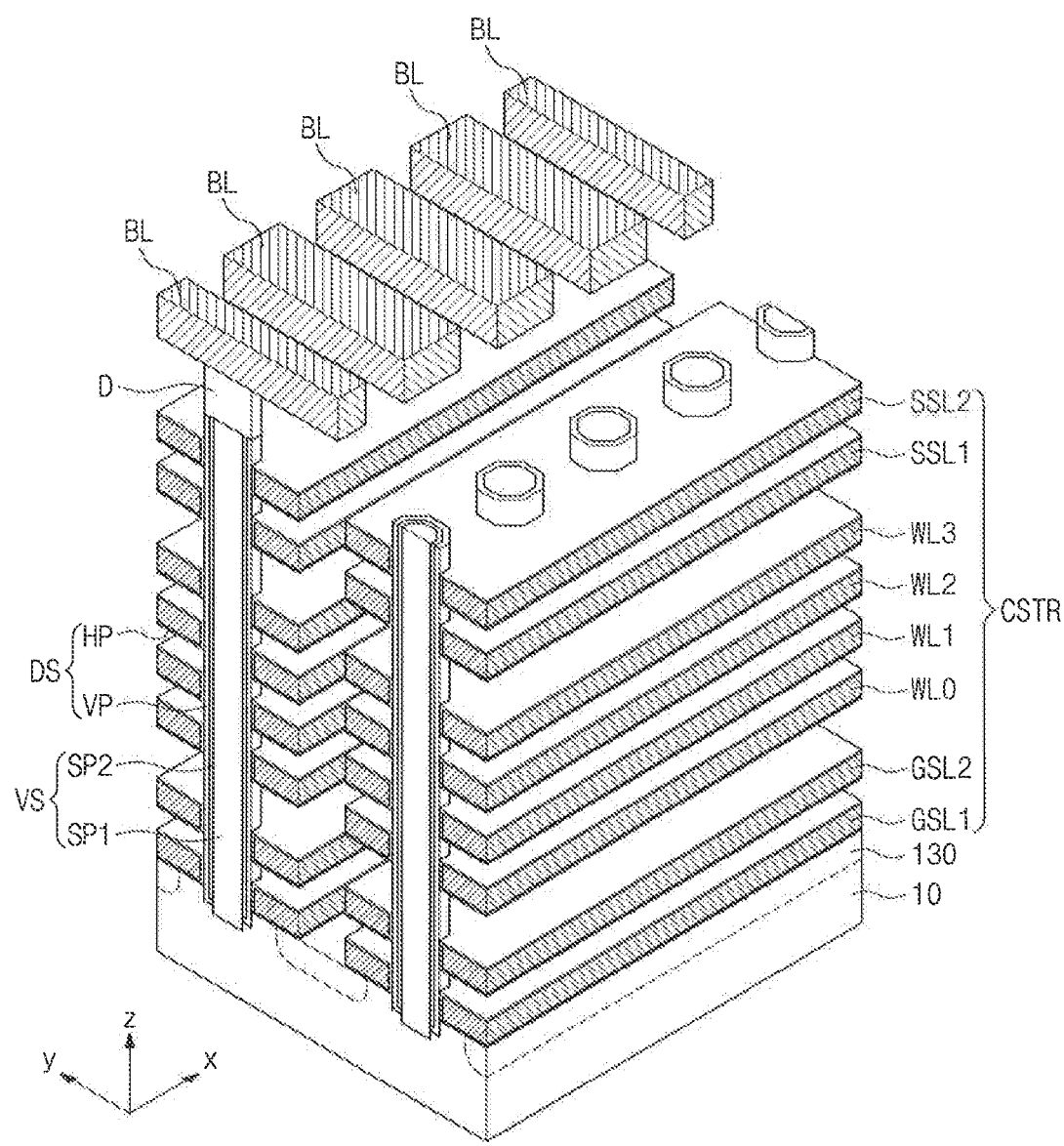
FIG. 4 is a perspective view of a cell array of a three-dimensional semiconductor memory device according to an exemplary embodiment of the inventive concept.

FIG. 4 is a perspective view of a cell array of a three-dimensional semiconductor memory device according to an exemplary embodiment of the inventive concept.

Referring to FIG. 4, the common source line CSL of FIG. 3 corresponds to an impurity region 130 formed in the substrate 10. Alternatively, the common source line CSL of FIG. 3 corresponds to a conductive thin film disposed on the substrate 10. Bit lines BL are two-dimensionally arranged, and cell strings CSTR are connected in parallel to each of the bit lines BL. The cell strings CSTR are two-dimensionally arranged on the substrate 10. For example, the cell strings CSTR are arranged in a y-direction. Each cell string CSTR is spaced apart from other cell strings CSTR. Each cell string CSTR is extended in an x-direction.

Each of the cell strings CSTR includes ground selection lines GSL1 and GSL2, word lines WL0~WL3, and string selection lines SSL1 and SSL2. The cell strings CSTR are disposed between the common source line CSL and the bit lines BL. The two string selection lines SSL1 and SSL2 may constitute a string selection line SSL of FIG. 3, and the two ground selection lines GSL1 and GSL2 may constitute a ground selection line GSL of FIG. 3. The ground selection lines GSL1 and GSL2, the word lines WL0~WL3, and the string selection lines SSL1 and SSL2 may be conductive patterns stacked on the substrate 10, serving as gate electrodes of corresponding transistors GST, MCT and SST.

Each of the cell strings CSTR includes a vertical structure VS. The vertical structures VS are vertically extended between the substrate 10 and the bit lines BL. The common source region 130 may be electrically connected to the bit line BL through the vertical structure VS. The vertical structure VS is formed to penetrate the ground selection lines GSL1 and GSL2, the word lines WL0~WL3, and the string selection lines SSL1 and SSL2. For example, the vertical structure VS penetrates conductive patterns GSL1 and GSL2, WL0~WL3, and SSL1 and SSL2 stacked on the substrate 10.

The vertical structures VS may be formed of a semiconductor material. The vertical structures VS include a first semiconductor pattern SP1 connected to the substrate 10 and a second semiconductor pattern SP2 disposed between the first semiconductor pattern SP1 and a data storage layer DS. The vertical structures VS include impurity regions D formed on their upper ends. For example, drain regions D are disposed on upper ends of the vertical structures VS.

The data storage layer DS may be disposed between the word lines WL0~WL3 and the vertical structures VS. The data storage layer DS may be a charge storage layer. For example, the data storage layer DS may include one of a trap insulating layer, a floating gate electrode, or an insulating layer including conductive nano dots. Data stored in the data storage layer may be changed using Fowler-Nordheim tunneling (FN tunneling) caused by a voltage difference between the vertical structure VS including a semiconductor material and the word lines WL0~WL3. Alternatively, the data storage layer DS may be a thin layer (e.g., a thin layer for a phase change memory device or a thin layer for a variable resistance memory device) which is capable of storing data based on another operation principle.

The data storage layer DS includes a vertical pattern VP penetrating the word lines WL0~WL3 and a horizontal pattern HP extending from between the word lines WL0~WL3 and the vertical pattern VP to top surfaces and bottom surfaces of the word lines WL0~WL3.

A dielectric layer used as a gate insulating layer of a transistor may be disposed between the ground selection lines GSL1 and GSL2 and the vertical structures VS or between the string selection lines SSL1 and SSL2 and the vertical structures VS. The dielectric layer may be formed of the same material as the data storage layer DS or may be a gate insulating layer (e.g., silicon oxide layer) for a Metal-Oxide-Semiconductor Field Effect Transistor (MOSFET).

The ground selection lines GSL1 and GSL2, the word lines WL0~WL3, the string selection lines SSL and SSL, and the vertical structures may constitute MOSFETs using the vertical structures VS as channel regions of the MOSFETs. Alternatively, the ground selection lines GSL1 and GSL2, the word lines WL0~WL3, the string selection lines SSL and SSL2, and the vertical structures VS may constitute a metal-oxide semiconductor (MOS) capacitor.

The ground selection lines GSL1 and GSL2, the word lines WL0~WL3, and the string selection lines SSL and SSL2 may serve as gate electrodes of selection and cell transistors SST and MCT, respectively. Inversion regions may be generated in the vertical structures VS by electric fields and a fringe field generated by voltages applied to the ground selection lines GSL1 and GSL2, the word lines WL0~WL3, and the string selection lines SSL1 and SSL2. Maximum length (or width) of the inversion region may be greater than thickness of the word lines WL0~WL3 or the selection lines SSL1, SSL2, GSL1, and GSL2 to form the inversion region. Accordingly, the inversion regions formed in the vertical structures VS may vertically overlap each other to form a current path to electrically connect a selected bit line BL and its corresponding common source line CSL of FIG. 3. For example, the cell string CSTR may include the ground and string transistor GST and SST of FIG. 3 including the lower and upper selection lines GSL1, GSL2, SSL1, and SSL2, and the cell transistors MCT of FIG. 3 including the word lines WL0~WL3. The ground and string transistors GST and SST, and the cell transistors MCT are connected in series to each other.

Figure 5:
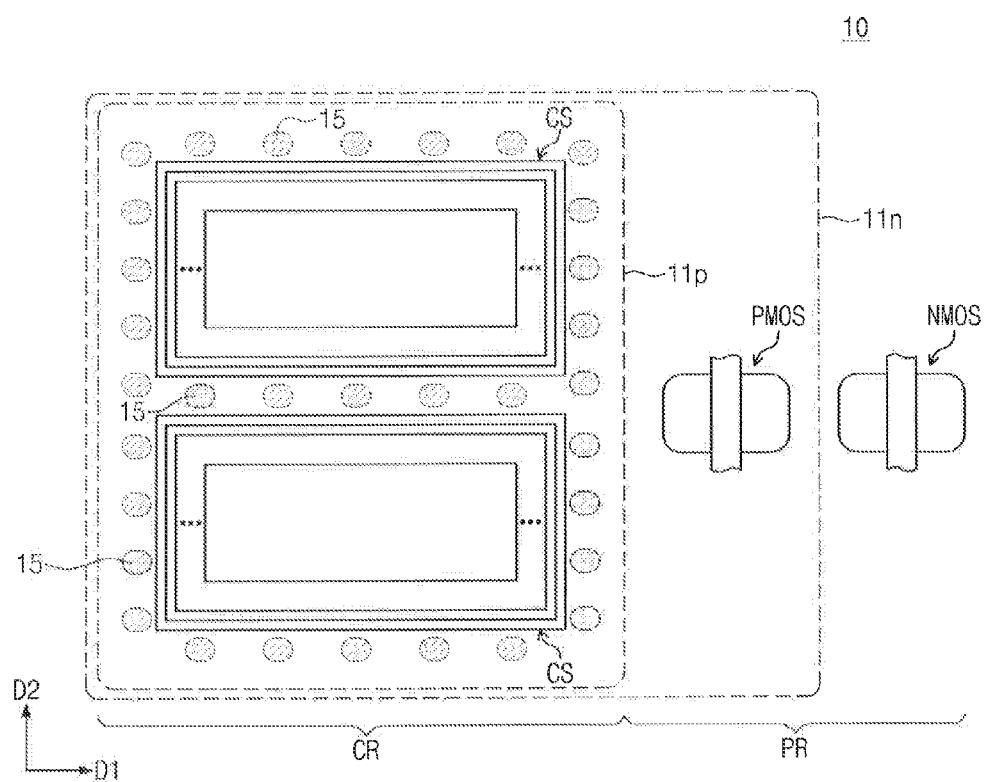
FIG. 5 is a schematic top plan view of a three-dimensional semiconductor memory device according to an exemplary embodiment of the inventive concept.

FIG. 5 is a top plan view of a three-dimensional semiconductor memory device according to an exemplary embodiment of the inventive concept.

Referring to FIG. 5, a semiconductor substrate 10 includes a cell region CR and a peripheral circuit region PR adjacent to the cell region CR. The semiconductor substrate 10 may be a silicon substrate, a silicon-germanium substrate, a germanium substrate or a single-crystal epitaxial layer grown on a single-crystal silicon substrate.

The semiconductor substrate 10 may have a first conductivity type. A well impurity layer 11$n$ of a second conductivity type is disposed in the semiconductor substrate 10. A pocket-well impurity layer 11$p$ of the first conductivity type is disposed within the well impurity layer 11$n$. For example, the well impurity layer 11$n$ may be formed by doping impurities of the second conductivity type into the semiconductor substrate 10 having impurities of the first conductivity type. The pocket-well impurity layer 11$p$ may be formed by doping impurities of the first conductivity type into the well impurity layer 11$n$.

Memory cell arrays may be disposed in the pocket-well impurity layer 11$p$ in the cell region CR, and peripheral circuits including PMOS and/or NMOS transistors may be disposed in the well impurity layer 11$n$ and the semiconductor substrate 10. For example, cell array structures CS are formed in the pocket-well impurity layer 11$p$. The cell array structures CS may include electrodes vertically stacked on the semiconductor substrate 10. This will be described in detail later with reference to FIGS. 6, 7A, and 7B.

Well pickup regions 15 are disposed in the pocket-well impurity layer 11$p$. For example, the well pickup regions 15 are disposed around the cell array structures CS. The well pickup regions 15 may be formed by doping the same impurity as the pocket-well impurity region 11$p$. For example, the well pickup regions 15 may be doped with impurities of the first conductivity type. An impurity concentration in the well pickup regions 15 may be higher than that in the pocket-well impurity layer 11p. A high erase voltage (e.g., about 20 volts) may be applied to the pocket-well impurity layer 11p through the well pickup regions 15 during an erase operation of the three-dimensional semiconductor memory device. Here, a uniform erase voltage may be applied to the pocket-well impurity layer 11p because the well pickup regions 15 are disposed in the pocket-well impurity layer 11p around the cell array structures CS.

PMOS transistors PMOS are disposed in the well impurity layer 11n of the peripheral circuit region PR, and NMOS transistors NMOS are disposed in the semiconductor substrate 10 of the peripheral circuit region PR.

Figure 6:
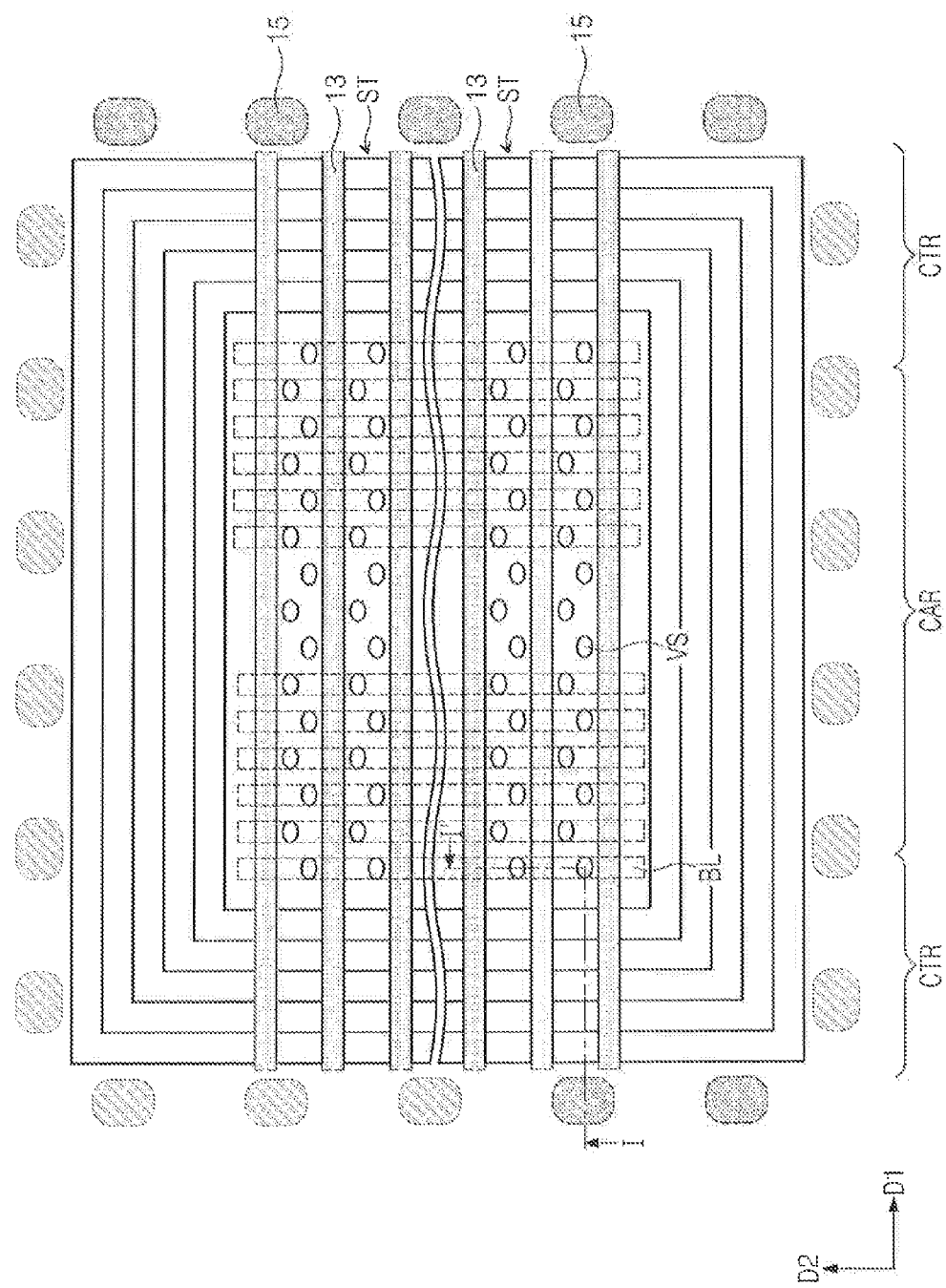
FIG. 6 is a top plan view of a cell region of the three-dimensional semiconductor memory device of FIG. 5.
Figure 7A:
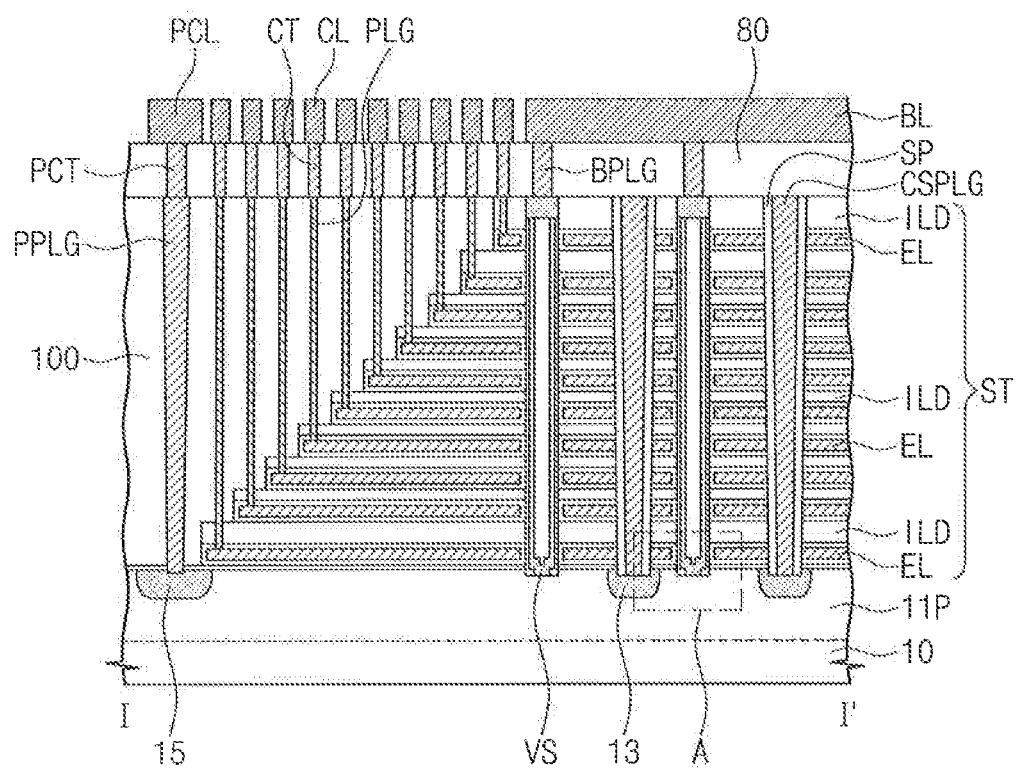
FIG. 7A is a cross-sectional view taken along line I-I' in FIG. 6.
Figure 7B:
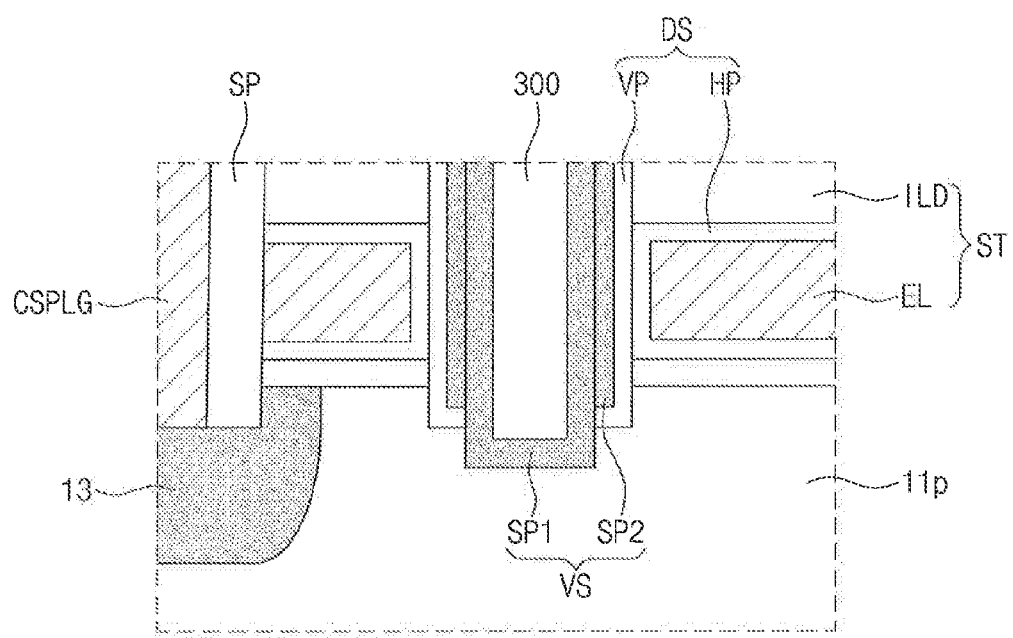
FIG. 7B is an enlarged view of a portion "A" in FIG. 7A.

FIG. 6 is a top plan view of a cell region of the three-dimensional semiconductor memory of FIG. 5. FIG. 7A is a cross-sectional view of the three-dimensional semiconductor taken along line I-I' in FIG. 6. FIG. 7B is an enlarged view of a portion "A" in FIG. 7A.

Referring to FIGS. 6 and 7A, a semiconductor substrate 10 includes a cell array region CAR and a contact region CTR formed around the cell array region CAR.

A cell array structure includes stacked structures ST and vertical structures VS. The stacked structures ST extend in parallel to each other in a first direction D1 on the semiconductor substrate 10. The vertical structures VS penetrate the stacked structures ST.

Each of the stacked structures ST includes electrodes EL and insulating layers ILD which are repeatedly and alternately stacked on the semiconductor substrate 10. The electrodes EL of the stacked structures ST may include a conductive material. For example, the electrodes EL of the stacked structures ST may include at least one of a doped semiconductor (e.g., doped silicon, etc.), metal (e.g., tungsten, copper, aluminum, etc.), conductive metal nitride (e.g., titanium nitride, tantalum nitride, etc.), and transition metal (e.g., titanium, tantalum, etc.). Thickness of the insulating layers ILD of the stacked structures ST may vary depending on the characteristics of a semiconductor memory device. For example, the thickness of the lowermost insulating layer ILD may be smaller than that of the other insulating layers ILD. For example, at least one insulating layer ILD may be thicker than the other insulating layers ILD. The insulating layers ILD may include silicon oxide.

The stacked structures ST have a stepwise structure in the contact region CTR to provide an electrical connection between electrodes EL and peripheral circuits. For example, vertical height of the stacked structure ST in the contact region CTR may increase as the stacked structure ST is closer to the cell array region CAR. For example, the stacked structures ST may have a sloped profile in the contact region CTR. A filling insulating layer 100 having a planarized surface is disposed on the semiconductor substrate 10 in the contact region CTR to cover ends of the electrodes EL disposed in the contact region CTR. A capping insulating layer 80 covers the staked structures ST and the filling insulating layer 100. Bit lines BL are disposed on the capping insulating layer 80 to extend in a second direction D2 across the stacked structures ST. The bit lines BL are electrically connected to the vertical structures VS through a bitline contact plug BPLG.

The vertical structures VS penetrate the stacked structures ST to be electrically connected to the semiconductor substrate 10. The vertical structures VS, when viewed from the above, are arranged in a zigzag form along the first direction D1 as shown in FIG. 6. Alternatively, the vertical structures VS, when viewed from the above, may be arranged in a straight line along one direction.

Referring to FIG. 7B, a vertical structure VS may include a semiconductor material. The vertical structure VS includes a first semiconductor pattern SP1 and a second semiconductor pattern SP2. The first semiconductor pattern SP1 is connected to the pocket-well impurity layer 11p. The second semiconductor pattern SP2 is disposed between the first semiconductor pattern SP1 and a data storage layer DS. The first semiconductor pattern SP1 may have a hollow pipe shape or a macaroni shape having a closed end. An insulating material 300 fills an inner region defined by the first semiconductor pattern SP1. Alternatively, the first semiconductor pattern SP1 may have a pillar shape.

As shown in FIG. 7B, the data storage layer DS includes a vertical pattern VP and a horizontal pattern HP. The vertical patter VP is disposed between the stacked structure ST and the vertical structure VS. The horizontal pattern HP is disposed between the electrode EL and the vertical pattern VP, and between the electrode EL and an insulating layer ILD.

Common source region 13 is disposed in the pocket-well impurity layer 11p. The common source region 13 is disposed adjacent to a stacked structure ST and is partially disposed underneath the stacked structure ST. The common source region 13 may be formed by doping impurities of a second conductivity type into the pocket-well impurity layer 11p. For example, the common source region 13 may have a conductivity type opposite to that of the pocket-well impurity layer 11p doped with impurities of a first conductivity type. The common source region 13 may be spaced apart from a bottom surface of the pocket-well impurity layer 11p.

Referring back to FIG. 6, the common source regions 13 extend in parallel to each other in the first direction D1. The stacked structures ST and the common source regions 13, when viewed from the above, are alternately and repeatedly arranged in the second direction D2.

Referring to FIGS. 7A and 7B, a common source structure is disposed between two adjacent stacked structures ST. The common source structure includes a sidewall insulating spacer SP and a common source plug CSPLG. The sidewall insulating spacer SP covers a sidewall of the stacked structure ST. The common source plug CSPLG is disposed on a sidewall insulating spacer SP to be connected to the common source region 13. A ground voltage may be applied to the common source region 13 through the common source plug CSPLG during a read or program operation of the three-dimensional semiconductor memory device. The common source plugs CSPLG may have substantially uniform upper widths and may extend in parallel to each other in a first direction. The sidewall insulating spacers SP are disposed between adjacent stacked structures ST and are disposed between the stacked structures ST and the common source plugs CSPLG. Alternatively, the sidewall insulating spacer SP may fill a space between two adjacent stacked structures ST, and thus the common source plug CSPLG is not disposed between the two adjacent stacked structures ST. A contact plug similar to the common source plug CSPLG may be formed outside the cell array to be locally in contact with the common source region 13. The sidewall insulating spacer SP may be formed of silicon oxide, silicon nitride, silicon oxynitride or a low-k dielectric material. The common source plug CSPLG may include at least one of metal (e.g., tungsten, copper, aluminum, etc.), conductive metal nitride (e.g., titanium nitride, tantalum nitride, etc.), and transition metal (e.g., titanium, tantalum, etc.).

An interconnection structure may be disposed in the contact region CTR to electrically connect the cell array structure and the peripheral logic structure. The interconnection structure includes contact plugs PLG and connection lines CL. The interconnection structure penetrates the filling insulating layer 100 to be connected to ends of the electrodes EL. The connection lines CL is disposed on the capping insulation layer 80 and connected to the contact plugs PLG through the contact patterns CT. Vertical lengths of the contact plugs PLG decrease as the contact plugs PLG are closer to the cell array region CAR. Top surfaces of the contact plugs PLG may be substantially coplanar with those of the vertical structures VS.

Referring back to FIG. 6, the well pickup regions 15 are disposed around the cell array structure. For example, the well pickup regions 15 are disposed adjacent to the lowermost electrode EL. The well pickup regions 15 are partially overlap the lowermost electrode EL, as shown in FIGS. 7A and 7B. Alternatively, the well pickup regions 15 may be spaced apart from the lowermost electrode EL. The well pickup regions 15 are spaced apart from each other. The well pickup regions may be formed by doping impurities of the first conductivity type into the pocket-well impurity layer 11p. For example, the well pickup regions 15 may have the same conductivity type as the pocket-well regions 11p.

Referring back to FIG. 7A, a well contact plug PPLG may be connected to a well pickup region 15. The well contact plug PPLG may have substantially the same height as the common source plug CSPLG. The well contact plug PPLG may include at least one of metal (e.g., tungsten, copper, aluminum, etc.), conductive metal nitride (e.g., titanium nitride, tantalum nitride, etc.), and transition metal (e.g., titanium, tantalum, etc.). A well conductive line PCL is disposed on the capping insulating layer 80 to be connected to the well contact plug PPLG through a well contact pattern PCT. The well contact plug PPLG may be connected to a peripheral circuit through the well conductive line PCL, and an erase voltage may be applied to the well pickup region 15 through the well contact plug PPLG during an erase operation.

Figure 9A:
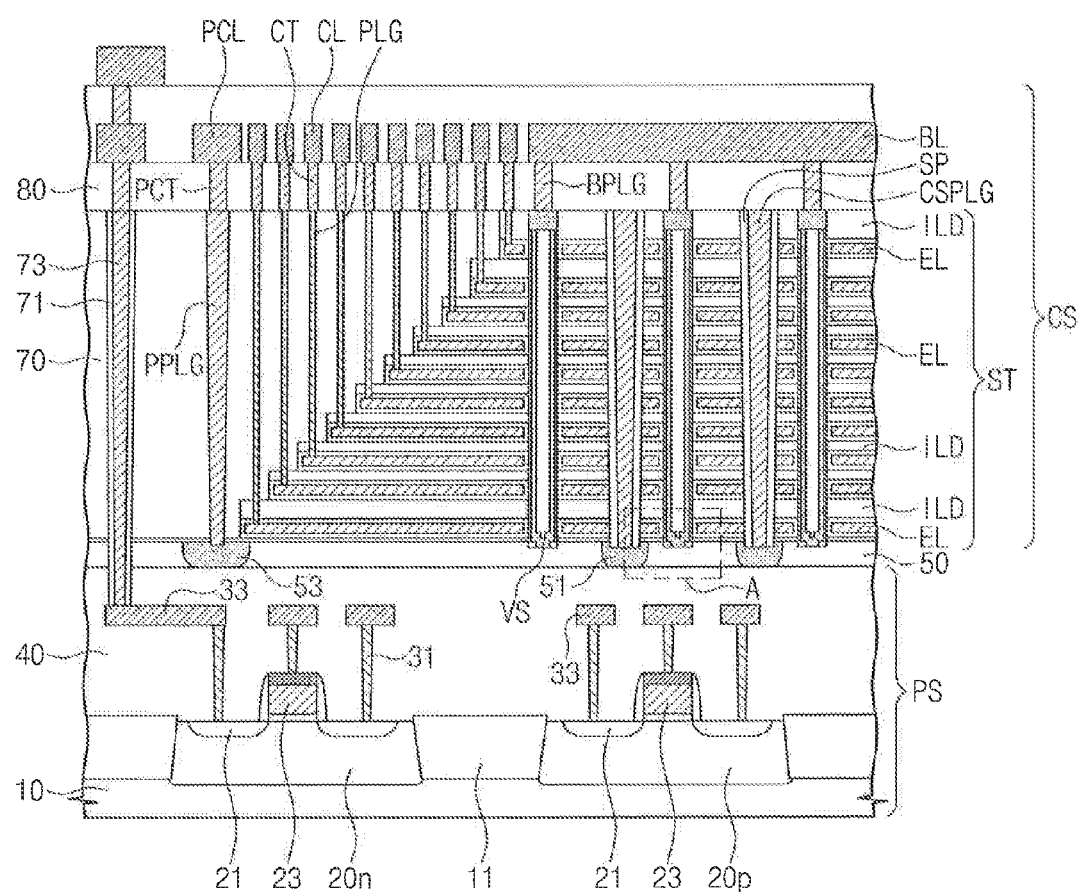
FIG. 9A is a cross-sectional view taken along line II-I' in FIG. 8.
Figure 9B:
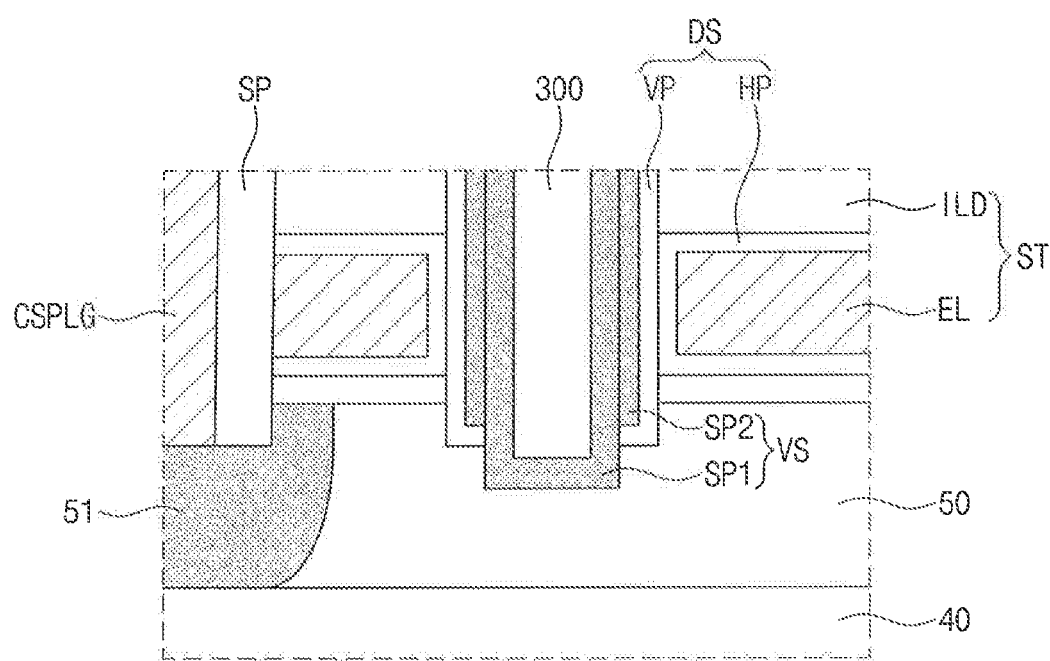
FIG. 9B is an enlarged view of a portion "A" in FIG. 9A.

FIG. 8 is a top plan view of a cell region of a three-dimensional semiconductor memory device according to an exemplary embodiment of the inventive concept. FIG. 9A is a cross-sectional view of the three-dimensional semiconductor device taken along line II-II' in FIG. 8. FIG. 9B is an enlarged view of a portion "A" in FIG. 9A.

Referring to FIGS. 8 and 9A, a peripheral logic structure PS and a cell array structure CS may be sequentially stacked on a semiconductor substrate 10. For example, the peripheral logic structure PS may be disposed between the semiconductor substrate 10 and the cell array structure CS in a sectional view thereof. For example, a peripheral circuit region and a cell array region may overlap each other when viewed from the above.

The peripheral logic structure PS may include the row and column decoders 2 and 4 of FIG. 2, and the page buffer 3 of FIG. 2, and control circuits. Such peripheral circuits may be formed on the semiconductor substrate 10. In addition, the semiconductor substrate 10 includes an n-well region 20n doped with n-type impurities and a p-well region 20p doped with p-type impurities. In the n-well region 20n and the p-well region 20p, active regions may be defined by a device isolation layer 11.

The peripheral logic structure PS includes a gate electrode 23, source and drain impurity regions 21 adjacent to both sides of the gate electrode 23, and a lower filling insulating layer 40. The lower filling insulating layer 40 may be disposed between the substrate 10 and the stacked structures ST, covering peripheral circuits. For example, PMOS transistors may be formed on the n-well region 20n and NMOS transistors may be formed on the p-well region 20. The gate electrode 23 may be disposed on the n-well region 20n and the p-well region 20p, and the source and drain impurity regions 21 may be disposed adjacent to both sides of the gate electrode 23. Peripheral circuit plugs 31 and peripheral circuit interconnections 33 may be connected to the NMOS and PMOS transistors.

The cell array structure CS includes a horizontal semiconductor layer 50, stacked structures ST and vertical structures VS. The horizontal semiconductor layer 50 is disposed on the lower filling insulating layer 40 covering peripheral circuits. The stacked structures ST include electrodes EL vertically stacked on the horizontal semiconductor layer 50. The vertical structures VS respectively penetrate the stacked structures ST.

The horizontal semiconductor layer 50 may include silicon (Si), germanium (Ge) or a mixture thereof and may be a semiconductor doped with impurities of a first conductivity type or an intrinsic semiconductor. The horizontal semiconductor layer 50 may have a crystal structure including at least one of single-crystalline, amorphous, and polycrystalline structures.

The stacked structures ST extend in parallel to each other in a first direction D1 on the horizontal semiconductor layer 50 and are spaced apart from each other in a second direction D2. Each of the stacked structures ST includes electrodes EL and insulating layer ILD that are repeatedly and alternately stacked on the horizontal semiconductor layer 50. The stacked structures ST have a stepwise structure in the contact region CTR to provide an electrical connection between the electrodes EL and the peripheral circuit structures PS. An upper filling insulating layer 70 is disposed on the horizontal semiconductor layer 50 to cover ends of the electrodes EL having a stepwise structure. A capping insulating layer 80 covers the stacked structures ST and the upper filling insulating layer 70. Bit lines BL are disposed on the capping insulating layer 80 and extended in the second direction D2 crossing the first direction D1. The bitlines BL may be electrically connected to the vertical structure VS through bitline contact plugs BPLG.

The vertical structures VS penetrate the stacked structures ST to be connected to the horizontal semiconductor layer 50. The vertical structures VS may include a semiconductor material. Bottom surfaces of the vertical structures VS are disposed in recessed regions of the horizontal semiconductor layer 50. Contact pads D are disposed on upper ends of the vertical structures VS to be connected to the bitline contact plug BPLG.

Referring to FIG. 9B, a data storage layer DS includes a vertical pattern VP and a horizontal pattern HP. The vertical pattern VP is disposed between a vertical structure VS and a stacked structure ST. The horizontal pattern HP is disposed between an insulating layer ILD and an electrode EL, and between the vertical structure VS and the electrode EL.

Referring back to FIG. 8, each of common source regions 51 is disposed between two adjacent stacked structures ST and extends in parallel to the stacked structures ST in the first direction D1. The common source regions 51 may be formed by doping impurities of a second conductivity type into the horizontal semiconductor layer 50. Bottom surfaces of the common source regions 51 may be in contact with the lower filling insulating layer 40, as shown in FIG. 9B. For example, depth of the common source regions 51 may be substantially equal to thickness of the horizontal semiconductor layer 50.

Referring back to FIG. 9B, the common source plug CSPLG is connected to the common source region 51. A sidewall insulating spacer SP is disposed between the common source plug CSPLG and the stacked structure ST. A ground voltage may be applied to the common source region 51 through a conductive pattern during a read or program operation of a three-dimensional semiconductor memory device. The common source plugs CSPLG may have substantially uniform upper widths and may extend in parallel to each other in the first direction D1. As shown in FIG. 9A, sidewall insulating spacers SP are disposed between two adjacent stacked structures ST. Alternatively, the sidewall insulating spacer SP may fill a space between two adjacent stacked structures ST, In this case, the common source plug CSPLG is not disposed between the two adjacent stacked structures ST. A contact plug may be disposed outside the cell array structure CS to locally be in contact with the common source region 51.

An interconnection structure may be disposed on ends of the stacked structures ST having a stepwise structure to provide an electrical connection between the cell array structure CS and the peripheral logic structure PS. The upper filling insulating layer 70 is disposed to cover the ends of the stacked structures ST on the horizontal semiconductor layer 50, and the interconnection structure includes contact plugs PLG connected to the ends of the electrodes EL and connection lines CL connected to the contact plugs PLG through the contact patterns CT on the upper filling insulating layer 70. The vertical heights of the contact plugs PLG decrease as the contact plugs PLG are closer to the cell array region CAR. Top surfaces of the contact plugs PLG may be substantially coplanar with those of the vertical structures VS.

Referring back to FIG. 8, well pickup regions 53, when viewed from the above, are disposed adjacent to both ends of each of the stacked structures ST. For example, the well pickup regions 53 are spaced apart from each other in the first direction D1. The well pickup regions 53 are disposed between two adjacent common source regions 51. For example, the common source regions 51 are disposed between two adjacent well pickup regions 53 in the second direction D2. The well pickup regions 53 may be formed by doping impurities of the first conductivity type into the horizontal semiconductor layer 50. The well pickup regions 53 may have the same conductivity type as the horizontal semiconductor layer 50, and impurity concentration in the well pickup regions 53 may be higher than that in the horizontal semiconductor layer 50. Bottom surfaces of the well pickup regions 53 may be in contact with the lower filling insulating layer 40. For example, depths of the well pickup regions 53 may be substantially equal to thickness of the horizontal semiconductor layer 50.

Referring back to FIG. 9A, a well contact plug PPLG is connected to a well pickup region 53. The well contact plug PPLG penetrates the upper filling insulating layer 70, and a top surface of the well contact plug PPLG may be substantially coplanar with the top surfaces of the vertical structures VS. The well contact plug PPLG may be connected to peripheral circuits through a well conductive line PCL, and an erase voltage may be applied to the well pickup region 53 through the well conductive line PCL and the well contact plug PPLG during an erase operation. The erase voltage may be applied to the horizontal semiconductor layer 50 below the stacked structures ST through the well pickup region 53.

For example, the erase voltage may be uniformly applied to portions of the horizontal semiconductor layer 50 isolated between the common source regions 51.

The cell array structure CS and the peripheral logic structure PS may be electrically connected to each other through a connection contact plug 73. The connection contact plug 73 penetrates the upper filling insulating layer 70 and the horizontal semiconductor layer 50 to be connected to peripheral circuit interconnections 33 of the peripheral logic structure PS. An insulating spacer 71 surrounds the connection contact plug 73 such that the connection contact plug 73 and the horizontal semiconductor layer 50 are electrically insulated from each other. Thickness of the horizontal semiconductor layer 50 may be reduced to reduce vertical length of the connection contact plug 73 connecting the cell array structure CS to the peripheral logic structure PS.

Figure 10A:
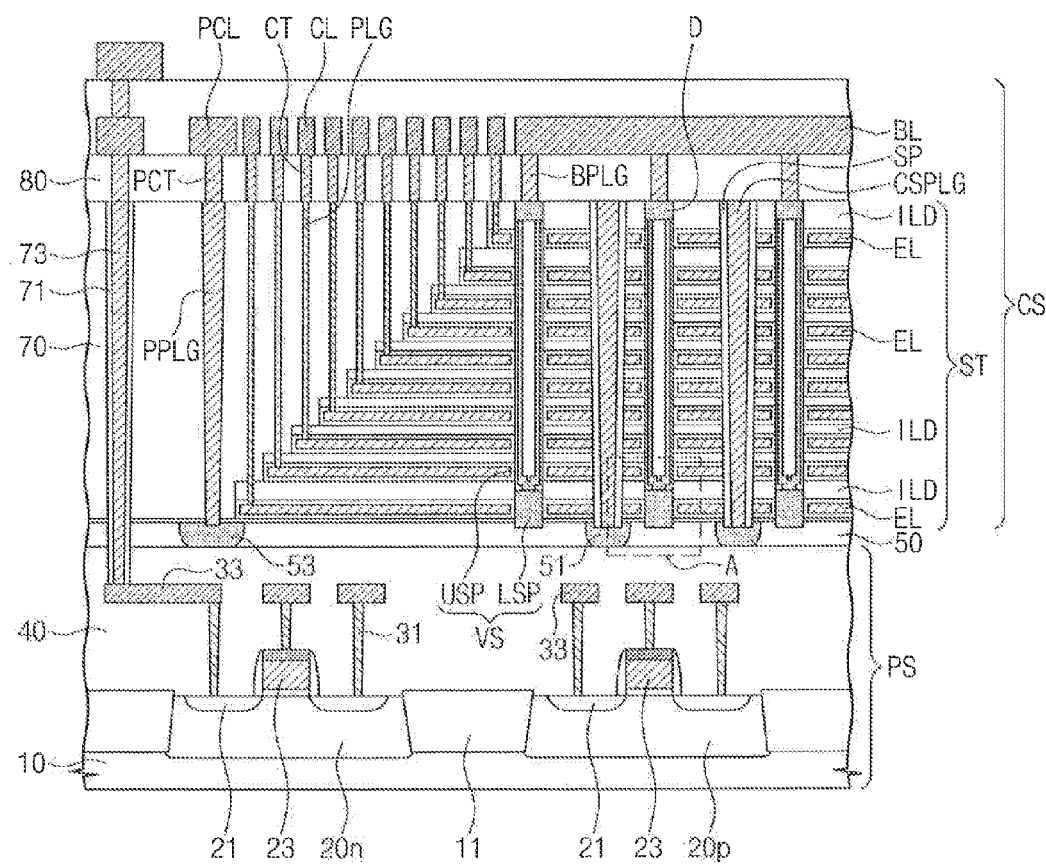
FIGS. 10A, 10B, 11, and 12 illustrate modified examples of the three-dimensional semiconductor memory device of FIG. 8 according to an exemplary embodiment.
Figure 10B:
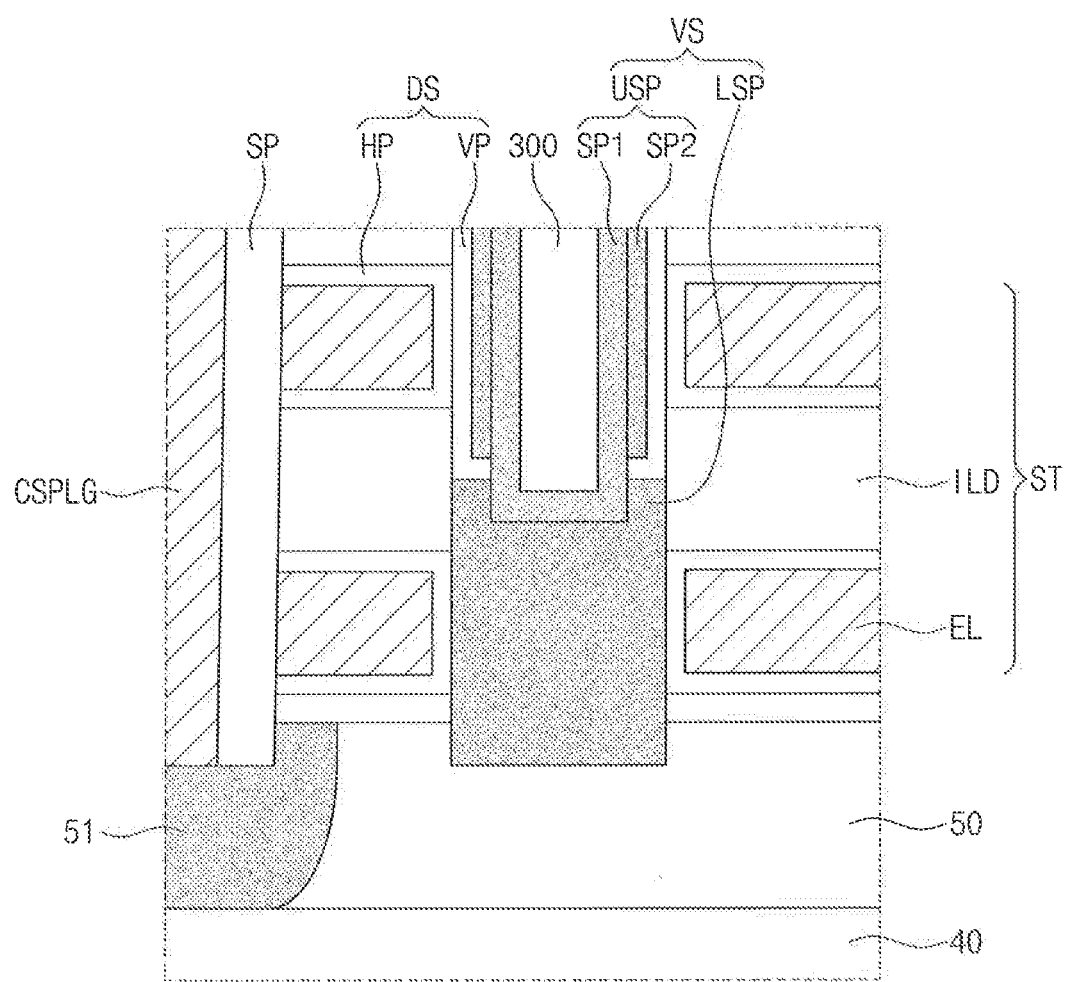
Figure 11:
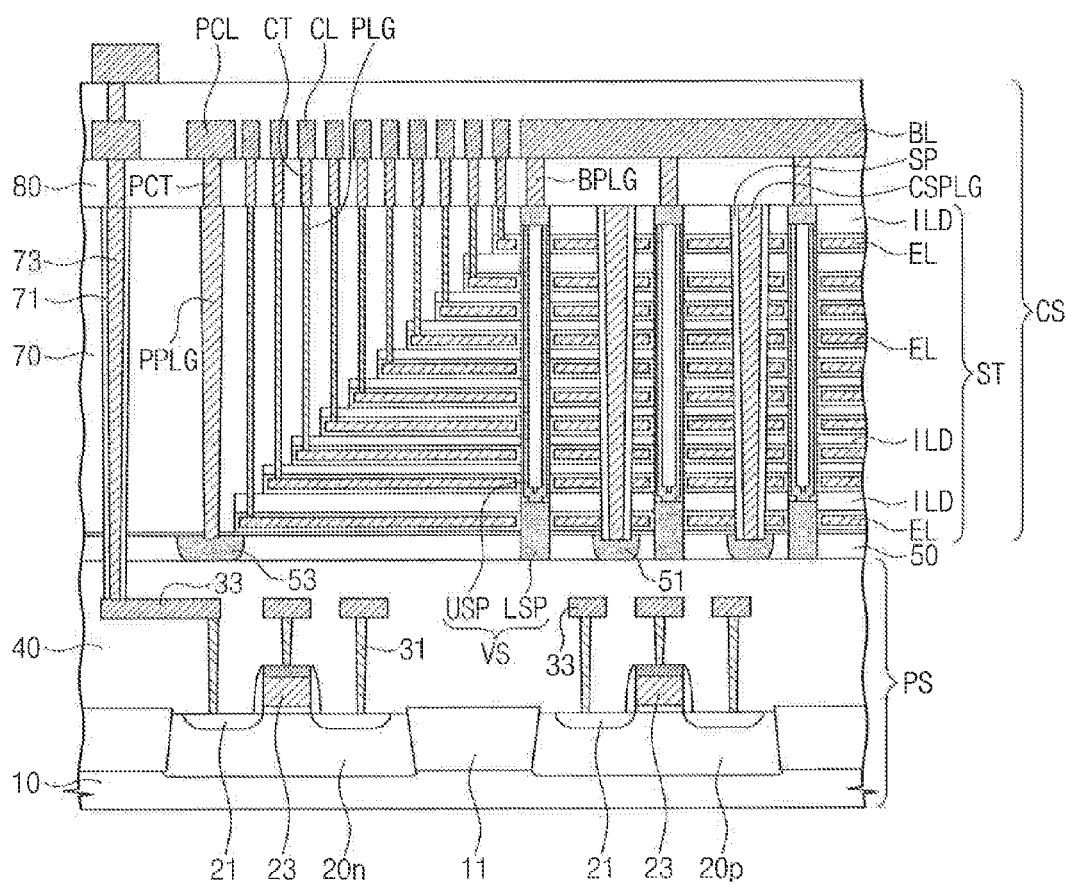
Figure 12:
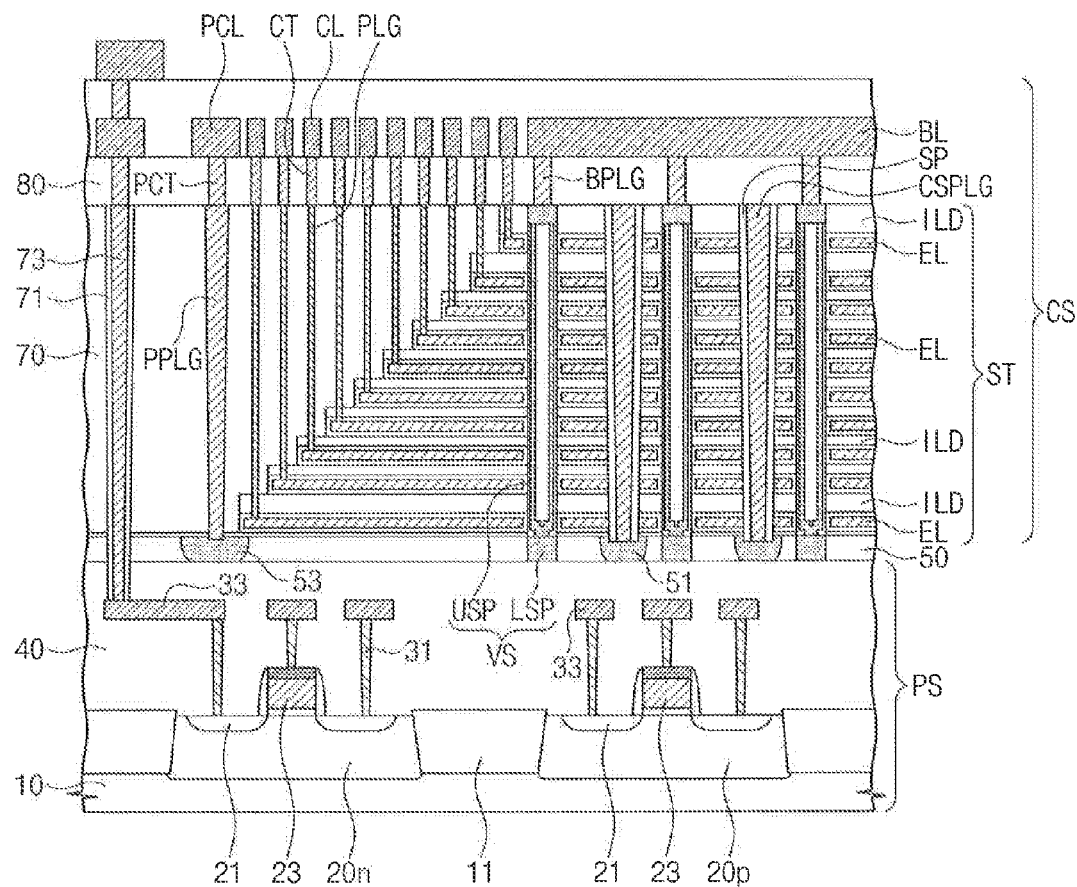

FIGS. 10A, 10B, 11, and 12 illustrate modified examples of the three-dimensional semiconductor memory device of FIG. 8 according to an exemplary embodiment of the inventive concept. FIG. 10B is an enlarged view of a portion "A" in FIG. 10A. FIGS. 10A, 11 and 12 are cross-sectional views of the three-dimensional semiconductor device taken along line II-II' in FIG. 8 according to an exemplary embodiment of the inventive concept.

According to an exemplary embodiment described in FIGS. 10A, 10B, 11, and 12, each of the vertical structures VS includes a lower semiconductor pattern LSP connected to a horizontal semiconductor layer 50 and penetrating a lower portion of a stacked structure ST and an upper semiconductor pattern USP connected to a lower semiconductor pattern LSP and penetrating an upper portion of the stacked structure ST. A vertical pattern VP of a data storage layer DS is disposed between the upper semiconductor pattern USP and the stacked structure ST, as shown in FIG. 10B. The horizontal semiconductor layer 50 may be an epitaxial layer or poly-crystalline layer formed by an epitaxial growth process. The horizontal semiconductor layer may be formed of silicon, for example.

The upper semiconductor pattern USP may have a hollow pipe shape or a macaroni shape having a closed lower end. The inside of the upper semiconductor pattern USP is filled with a filling insulating pattern 300. A bottom surface of the upper semiconductor pattern USP is lower than a top surface of the lower semiconductor pattern LSP. For example, the lower end of the upper semiconductor pattern USP is inserted into the lower semiconductor pattern LSP. The upper semiconductor pattern USP may be formed of a semiconductor material. For example, the upper semiconductor pattern USP may include silicon (Si), germanium (Ge) or a mixture thereof and may be a doped semiconductor or an intrinsic semiconductor. The upper semiconductor pattern USP may have a crystal structure including at least one of single-crystalline, amorphous, and polycrystalline structures. The upper semiconductor pattern USP may have a conductive pad D disposed on its upper end. The conductive pad D may be an impurity region doped with impurities or may be formed of a conductive material.

The upper semiconductor pattern USP includes a first semiconductor pattern SP1 and a second semiconductor pattern SP2. The first semiconductor pattern SP1 is connected to the lower semiconductor pattern LSP and may be pipe-shaped or macaroni-shaped having a closed lower end. The inside of the first semiconductor pattern SP1 is filled with a filling insulating pattern 300. The first semiconductor pattern SP1 is in contact with an inner wall of the second semiconductor pattern SP2 and a top surface of the lower semiconductor pattern LSP. For example, the first semiconductor pattern SP1 may be electrically connected to the second semiconductor pattern SP2 and the lower semiconductor pattern LSP. The semiconductor pattern SP2 covers an inner sidewall of the stacked structure ST. The second semiconductor pattern SP2 may be pipe-shaped or macaroni-shaped having open upper and lower ends. The open lower end of the second semiconductor pattern SP2 is spaced apart from the lower semiconductor pattern LSP without being in contact with the lower semiconductor pattern LSP. The first and second semiconductor patterns SP1 and SP2 may be undoped or may be doped with impurities having the same conductivity type as the horizontal semiconductor layer 50. The first and second semiconductor patterns SP1 and SP2 may be in a polycrystalline state or a single-crystalline state.

The lower semiconductor pattern LSP may serve as the channel region of the ground selection transistor GST as described with reference to FIG. 3. The lower semiconductor pattern LSP may be formed of a semiconductor material having the same conductivity type as the horizontal semiconductor layer 50. The lower semiconductor pattern LSP may be an epitaxial pattern formed by a selective epitaxial growth (SEG) process using the horizontal semiconductor layer 50 as a seed layer. In this case, the lower semiconductor pattern LSP may have a single-crystal structure or a polycrystalline structure with increased grain size compared with a resultant structure of a chemical vapor deposition (CVD) technique. Alternatively, the lower semiconductor pattern LSP may be formed of a polycrystalline semiconductor material (e.g., polysilicon).

The lower semiconductor pattern LSP may be pillar-shaped, penetrating the lowermost electrode EL, as shown in FIG. 10A. A bottom surface of the lower semiconductor pattern LSP is lower than a top surface of the horizontal semiconductor layer 50. The bottom surface of the lower semiconductor patter LSP is spaced apart from a top surface of the lower filling insulating layer 40. A top surface of the lower semiconductor pattern LSP is higher than that of the lowermost electrode EL. Alternatively, as shown in FIG. 11, the lower semiconductor pattern LSP may be pillar-shaped, penetrating the lowermost electrode EL and the horizontal semiconductor layer 50. For example, the lower semiconductor pattern LSP is in direct contact with the lower filling insulating layer 40, and a top surface of the lower semiconductor pattern LSP is higher than that of the lowermost electrode EL. Alternatively, as shown in FIG. 12, the lower semiconductor pattern LSP may be pillar-shaped, penetrating the horizontal semiconductor layer 50 only. A bottom surface of the lower semiconductor pattern LSP is in direct contact with the lower filling insulating layer 40, and a top surface of the lower semiconductor pattern LSP is lower than a bottom surface of the lowermost electrode EL.

Figure 13:
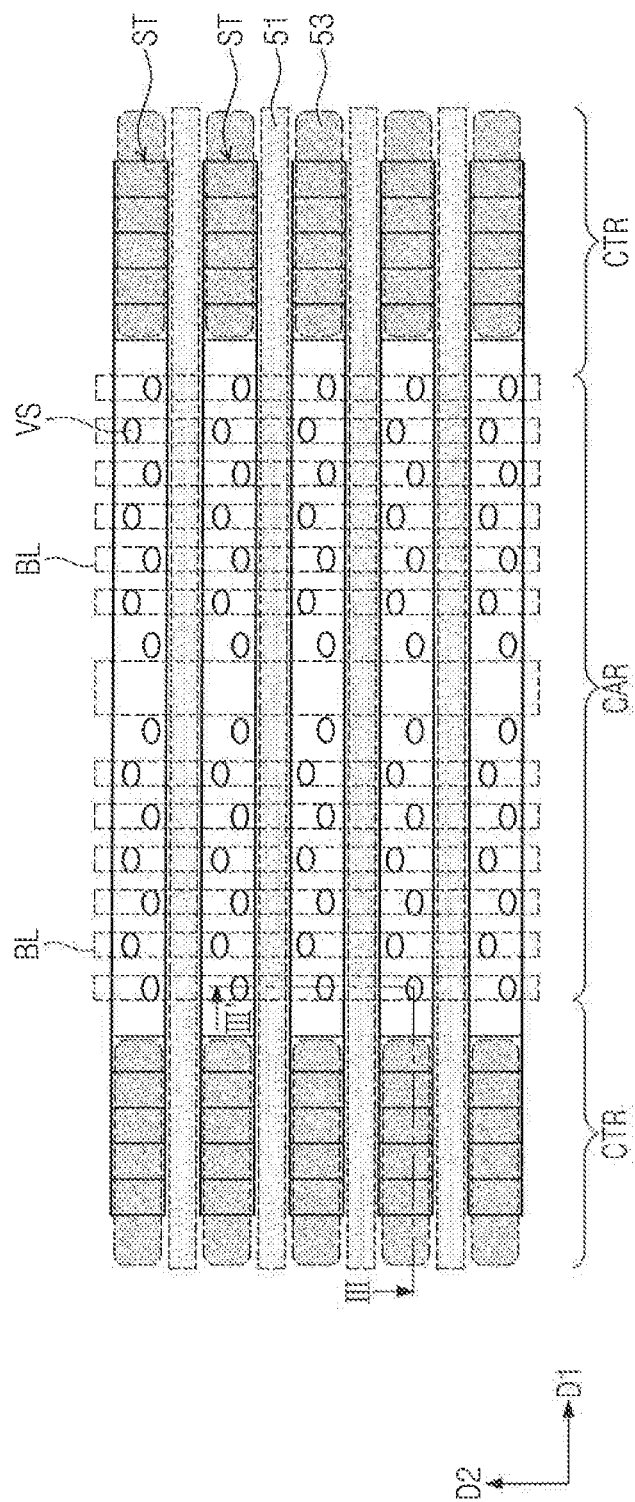
FIG. 13 is a top plan view of a cell region of a three-dimensional semiconductor memory device according to an exemplary embodiment of the inventive concept.
Figure 14:
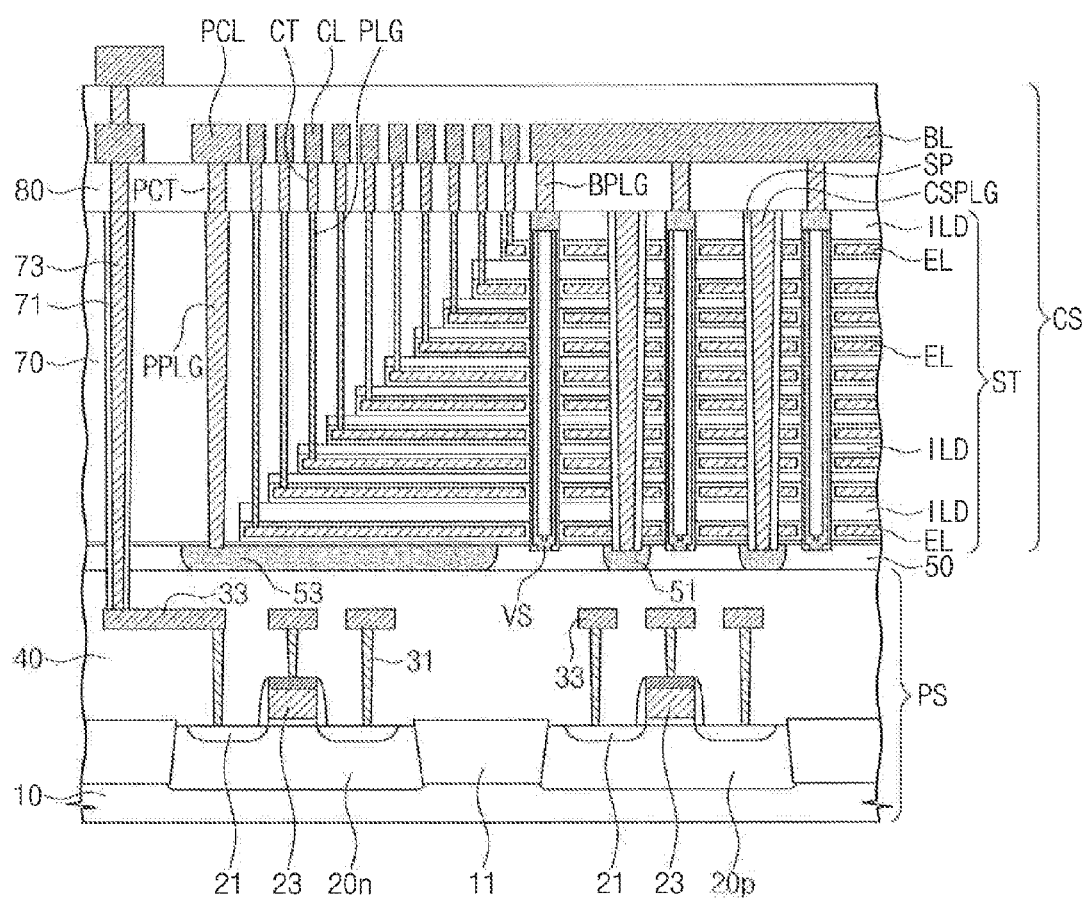
FIG. 14 is a cross-sectional view taken along line III-II' in FIG. 13.

FIG. 13 is a top plan view of a cell region of a three-dimensional semiconductor memory device according to an exemplary embodiment of the inventive concept. FIG. 14 is a cross-sectional view of the three-dimensional semiconductor memory device taken along line III-III' in FIG. 13.

Referring to FIGS. 13 and 14, a peripheral logic structure PS and a cell array structure CS are sequentially stacked on a semiconductor substrate 10.

The peripheral logic structure PS includes a gate electrode 23, source and drain impurity regions 21 adjacent to both sides of the gate electrode 23, and a lower filling insulating layer 40 covering peripheral circuits.

The cell array structure CS includes a horizontal semiconductor layer 50 disposed on the lower filling insulating layer 40. The cell array structure CS covers peripheral circuits. The cell array structure CS includes stacked structures ST and vertical structures VS. The stacked structures ST include electrodes EL vertically stacked on the horizontal semiconductor layer 50. The vertical structures VS penetrate the stacked structures ST. The stacked structures ST extend parallel to each other in a first direction D1. The stacked structures ST are spaced apart from each other in a second direction D2 on the horizontal semiconductor layer 50. As described above, the vertical structures VS are connected to the horizontal semiconductor layer 50. The vertical structures VS may include a semiconductor material.

Each common source region 51 is disposed between two adjacent stacked structures ST and extends in parallel to the stacked structures ST in the first direction D1. The common source regions 51 may be formed by doping impurities of a second conductivity type into the horizontal semiconductor layer 50. Bottom surfaces of the common source regions 51 are in contact with the lower filling insulating layer 40. For example, depth of the common source regions 51 may be substantially equal to thickness of the horizontal semiconductor layer 50.

Well pickup regions 53 are disposed at both ends of the stack structures ST in the horizontal semiconductor layer 50. For example, a pair of well pickup regions 53 is spaced apart from each other in the first direction D1 and is disposed at both ends of a stack structure ST. The well pickup regions 53 are partially disposed underneath the stack structures ST. Each of the common source regions 51 is disposed between two adjacent well pickup regions 53 in the second direction D2, and thus the well pickup regions 53 are separated from each other by the common source regions 51. The well pickup regions 53 may be formed by doping impurities of a first conductivity type into the horizontal semiconductor layer 50. The well pickup regions 53 are spaced apart from the vertical structures VS, and bottom surfaces of the well pickup regions 53 are in contact with the lower filling insulating layer 40. For example, depths of the well pickup regions 53 may be substantially equal to thickness of the horizontal semiconductor layer 50. The well pickup regions 53 are bar-shaped extending in the first direction D1. For example, the well pickup regions 53 are extended underneath the stack structures ST, and a well contact plug PPLG is connected to the well pickup region 53.

Figure 15:
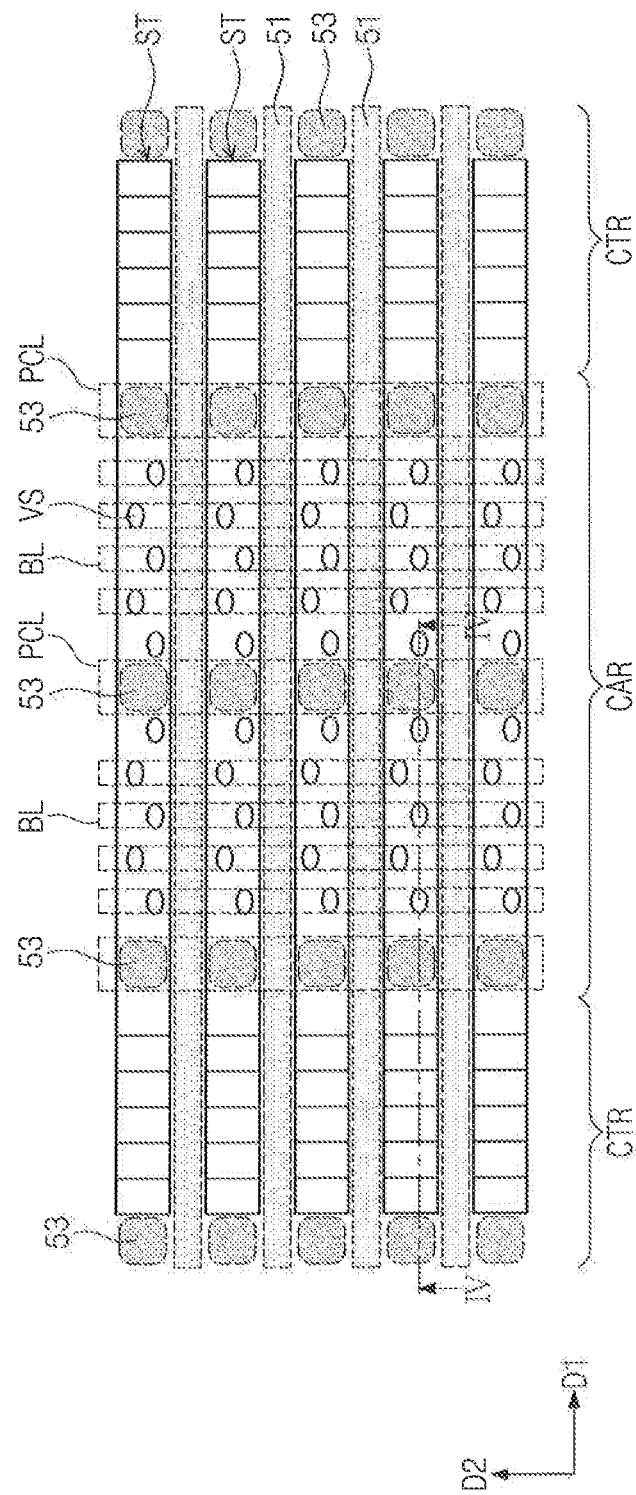
FIG. 15 is a top plan view of a cell region of a three-dimensional semiconductor memory device according to an exemplary embodiment of the inventive concept.
Figure 16:
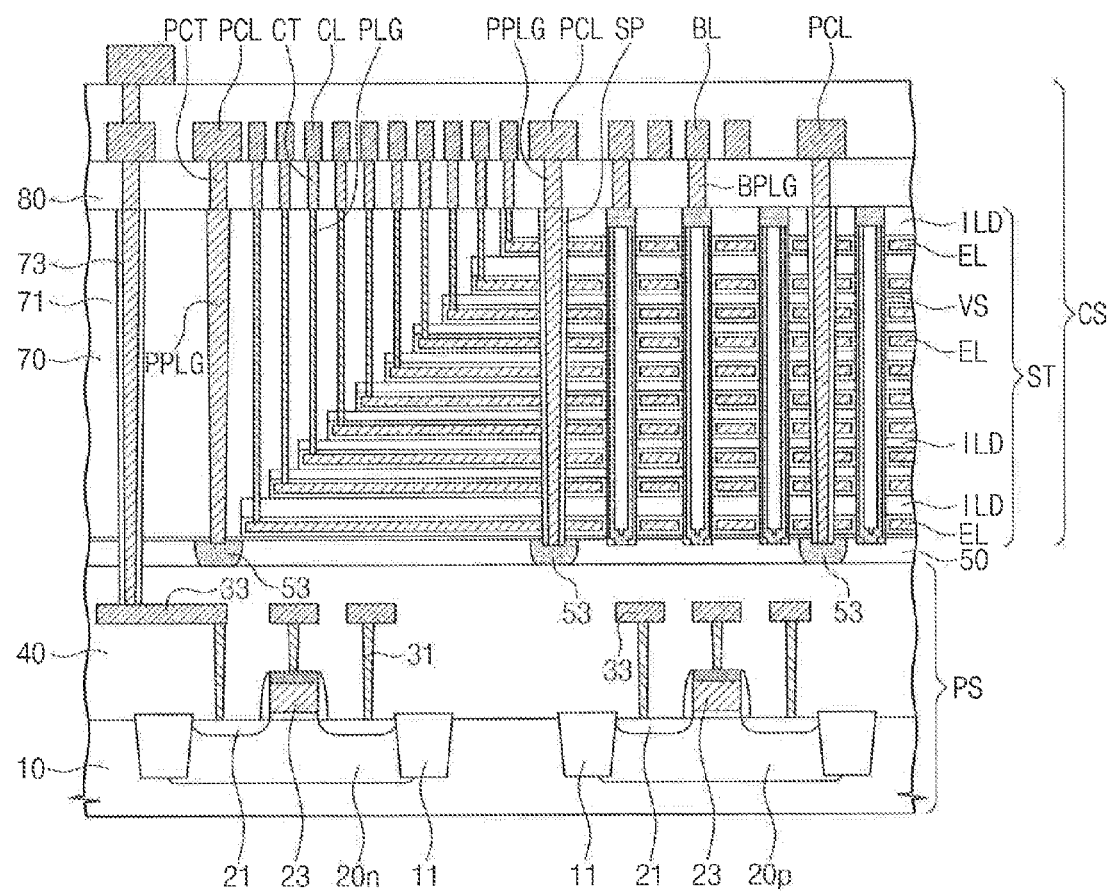
FIG. 16 is a cross-sectional view of the three-dimensional semiconductor memory device taken along line IV-IV' in FIG. 15.

FIG. 15 is a top plan view of a cell region of a three-dimensional semiconductor memory device according to an exemplary embodiment of the inventive concept. FIG. 16 is a cross-sectional view of the three-dimensional semiconductor memory device taken along line IV-IV' in FIG. 15.

Referring to FIGS. 15 and 16, a peripheral logic structure PS includes a gate electrode 23, source and drain impurity regions 21 adjacent to both sides of the gate electrode 23, and a lower filling insulating layer 40 covering peripheral circuits.

A cell array structure CS includes a horizontal semiconductor layer 50 and stacked structures ST. The horizontal semiconductor layer 50 is disposed on the lower filling insulating layer 40, covering peripheral circuits. For example, the horizontal semiconductor layer 50 may be formed using an epitaxial growth process, and may be formed of a semiconductor material such as silicon. The stacked structures ST include electrodes EL vertically stacked on the horizontal semiconductor layer 50. The vertical structures VS penetrate the stacked structures ST. The stacked structures ST extend in parallel to each other in a first direction D1 on the horizontal semiconductor layer 50. The stacked structures ST are spaced apart from each other.

As described above, the vertical structures VS penetrate the stacked structures ST to be connected to the horizontal semiconductor layer 50. The vertical structures VS may include a semiconductor material.

Each of common source regions 51 is disposed between two adjacent stacked structures ST, extending in parallel to the stacked structures ST in the first direction D1. The common source regions 51 may be formed by doping impurities of a second conductivity type into the horizontal semiconductor layer 50. Bottom surfaces of the common source regions 51 are in contact with the lower filling insulating layer 40. For example, depths of the common source regions 51 may be substantially equal to thickness of the horizontal semiconductor layer 50.

Each of well pickup regions 53 is disposed between two adjacent common source regions 51. The well pickup regions 53 are spaced apart from the vertical structures VS. The well pickup regions 53 may be formed by doping impurities of a first conductivity type into the horizontal semiconductor layer 50. Bottom surfaces of the well pickup regions 53 are in contact with the lower filling insulating layer 40. For example, depths of the well pickup regions 53 may be substantially equal to thickness of the horizontal semiconductor layer 50. The well pickup regions 53 are also disposed underneath the stacked structures ST. For example, the well pickup regions 53 are disposed in a contact region CTR and a cell array region CAR. Well contact plugs PPLG are connected to the well pickup regions 53 disposed in the cell array region CAR to apply an erase voltage thereto. A sidewall insulating spacer SP is disposed between the well contact plug PPLG and the stacked structures ST disposed in the cell array region CAR. Well conductive lines PCL are disposed on the cell array structure CS to extend in parallel to a bitline BL. The well conductive lines PCL may be electrically connected to the well pickup regions 53 through the well contact plug PPLG.

The well pickup regions 53 are disposed underneath each of the stacked structures ST, and thus holes may be rapidly provided to the vertical structures VS during an erase operation to enhance erase speed of memory cells.

Figure 17:
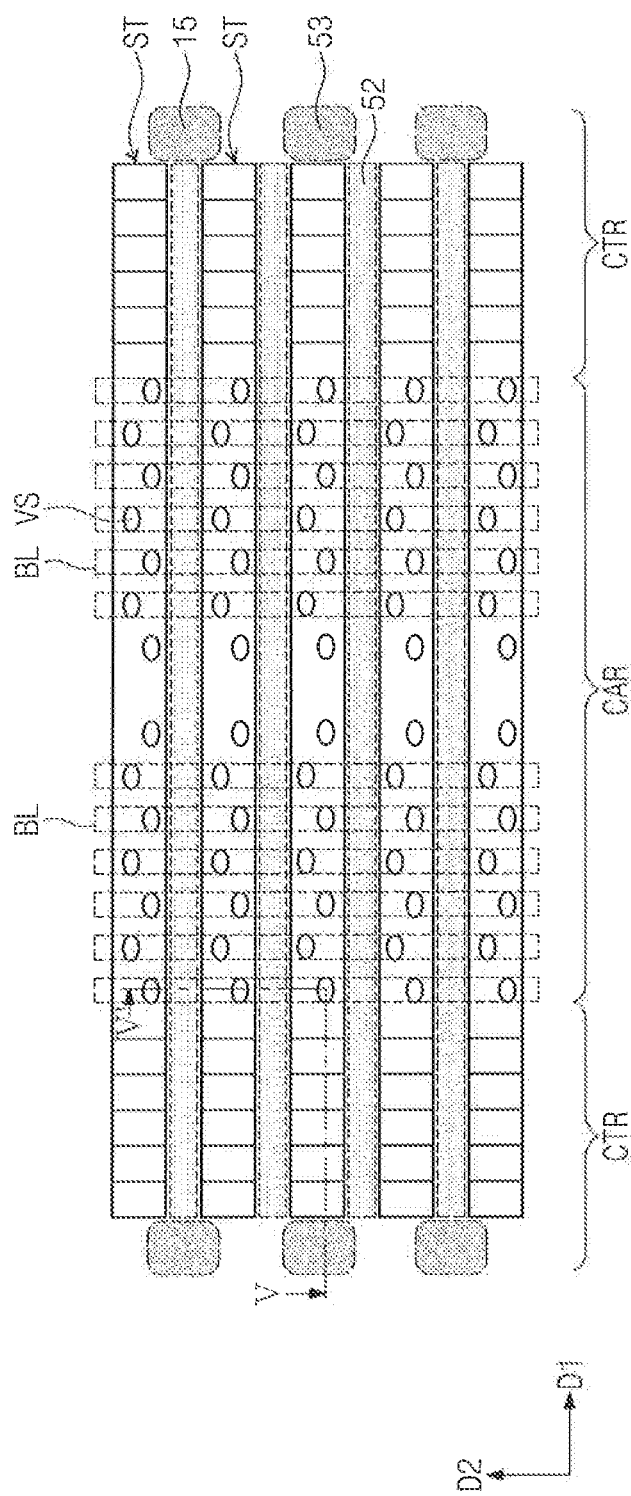
FIG. 17 is a top plan view of a cell region of a three-dimensional semiconductor memory device according to an exemplary embodiment of the inventive concept.
Figure 18:
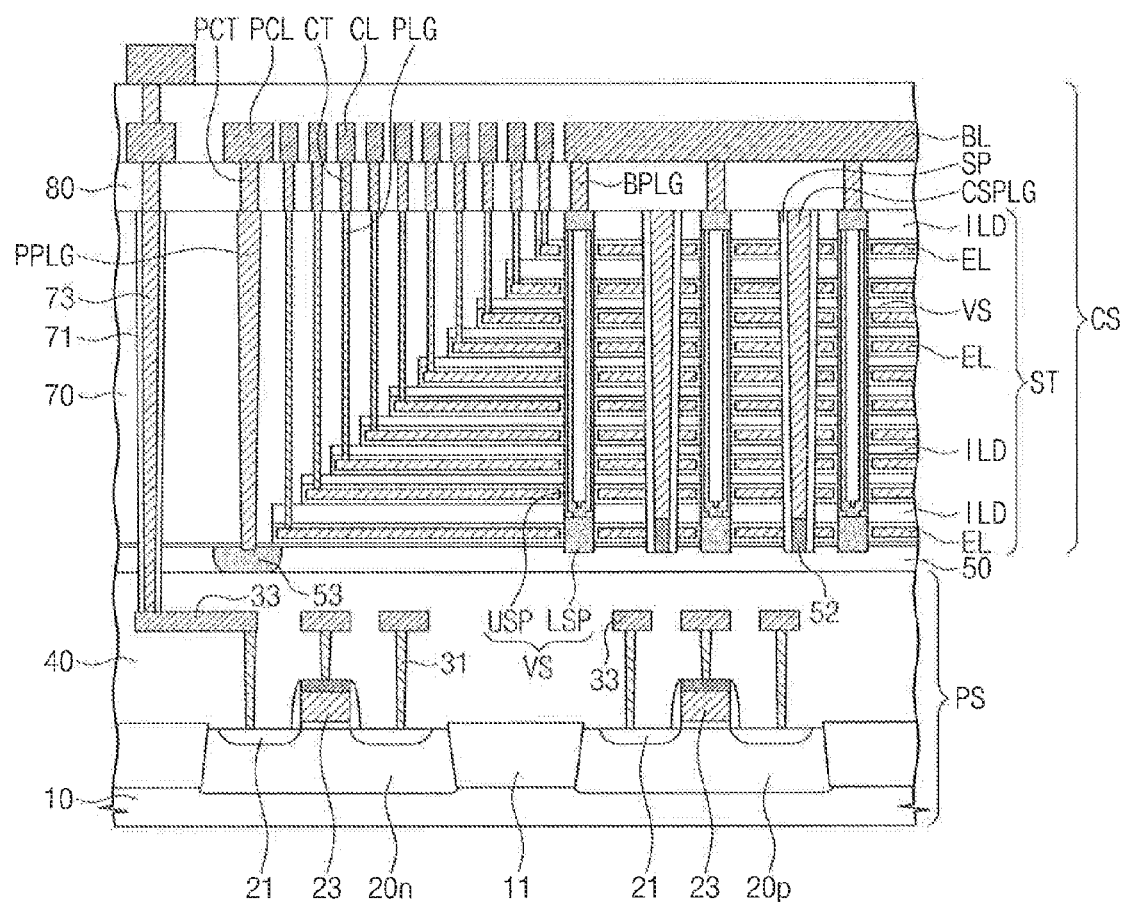
FIG. 18 is a cross-sectional view of the three-dimensional semiconductor memory device taken along line V-V' in FIG. 15.
Figure 19:
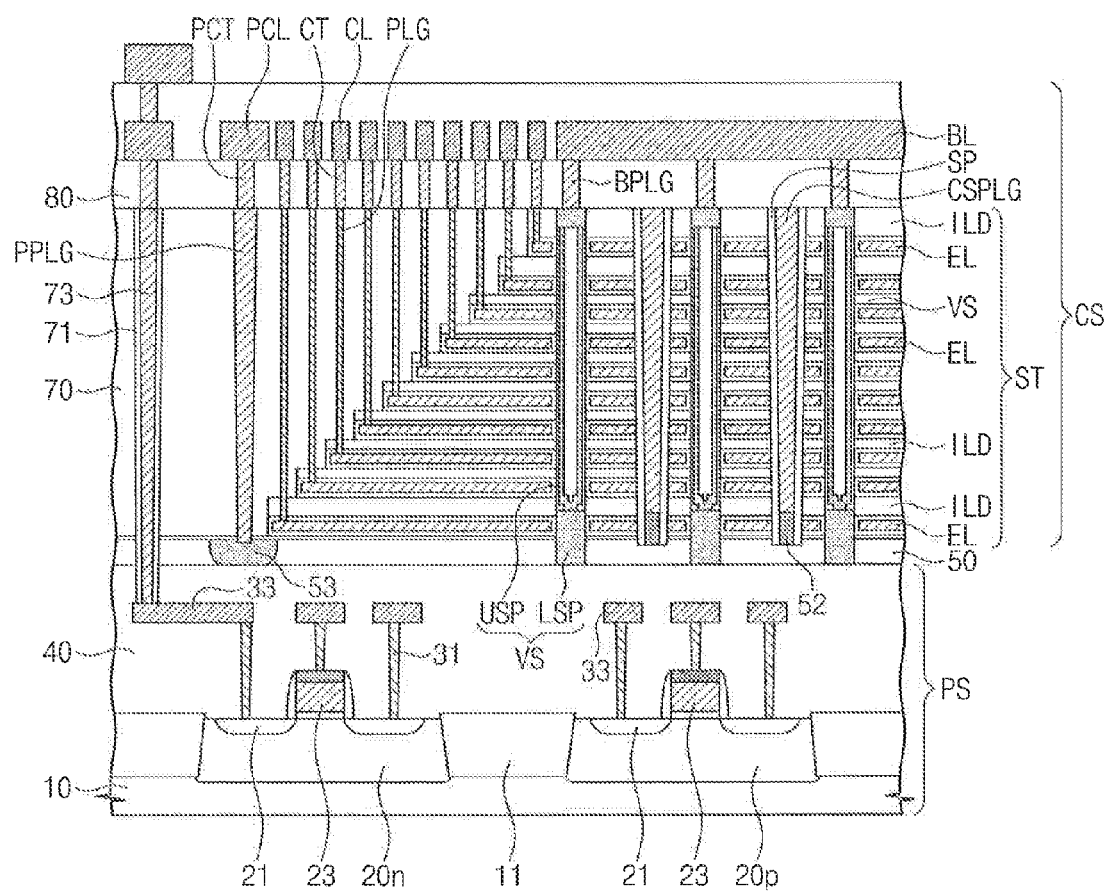
FIGS. 19 and 20 illustrate modified examples of the three-dimensional semiconductor memory device of FIG. 17 according to an exemplary embodiment of the inventive concept.
Figure 20:
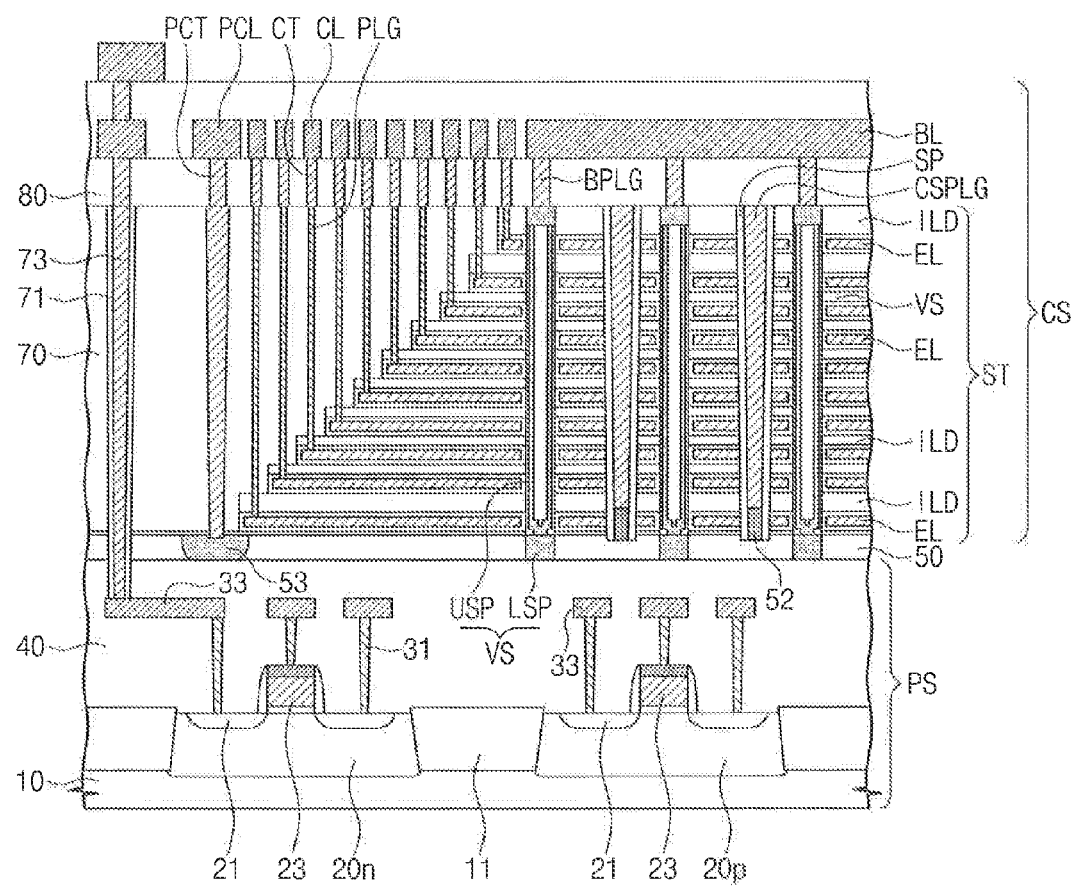

FIG. 17 is a top plan view of a cell region of a three-dimensional semiconductor memory device according to an exemplary embodiment of the inventive concept. FIG. 18 is a cross-sectional view of the three-dimensional semiconductor memory device taken along line V-V' in FIG. 15. FIGS. 19 and 20 illustrate cross-sectional views of three-dimensional semiconductor memory devices according to exemplary embodiments of the inventive concept.

Referring to FIGS. 17 and 18, a peripheral logic structure PS includes a gate electrode 23, source and drain impurity regions 21 adjacent to both sides of the gate electrode 23, and a lower filling insulating layer 40 covering peripheral circuits.

A cell array structure CS includes a horizontal semiconductor layer 50 formed on the lower filling insulating layer 40 covering peripheral circuits, stacked structures ST including electrodes EL vertically stacked on horizontal semiconductor layer 50, and vertical structures VS penetrating the stacked structures ST. The staked structures ST, extending in parallel to each other in a first direction D1 on the horizontal semiconductor layer 50, are spaced apart from each other in a second direction D2 crossing the first direction D1.

The vertical structures VS are connected to the horizontal semiconductor layer 50. The vertical structures VS may include a semiconductor material. Each of the vertical structures VS includes a lower semiconductor pattern LSP and an upper semiconductor pattern USP. The lower semiconductor pattern LSP may be an epitaxial pattern grown from the horizontal semiconductor layer 50 and may have the same conductivity type as the horizontal semiconductor layer 50. In FIG. 18, bottom surfaces of the lower semiconductor pattern LSP are spaced apart from a bottom surface of the horizontal semiconductor layer 50. A top surface of the lower semiconductor pattern LSP is higher than that of the lowermost electrode EL. In FIG. 19, a bottom surface of the lower semiconductor pattern LSP penetrates the horizontal semiconductor layer 50 to be in contact with the lower filling insulating layer 40. A top surface of the lower semiconductor pattern LSP is higher than that of the lowermost electrode EL. In FIG. 20, a bottom surface of the lower semiconductor pattern LSP is in contact with the lower filling insulating layer 40 and a top surface of the lower semiconductor pattern LSP is lower than a bottom surface of the lowermost electrode EL.

Each of common source regions 52 is disposed between two adjacent stacked structures ST, extending in parallel to the stacked structures ST in a first direction D1. Bottom surfaces of the common source regions 52 are spaced apart from a bottom surface of the horizontal semiconductor layer 50. The common source region 52 may be an epitaxial pattern that is epitaxially grown using the horizontal semiconductor layer 50 as a seed. The epitaxial pattern constituting the common source region 52 may have a conductivity type opposite to that of the horizontal semiconductor layer 50. The epitaxial pattern penetrates a lower portion of the stacked structure ST, and a sidewall insulating spacer SP is disposed between the epitaxial pattern and the stacked structures ST.

Referring to FIG. 18, a bottom surface of the common source region 52 may be disposed at substantially same height as a bottom surface of the lower semiconductor pattern LSP. The inventive concept is not limited thereto. For example, in FIG. 19, a bottom surface of the common source region 52 is spaced apart from a bottom surface of the horizontal semiconductor layer 50, and a bottom surface of the lower semiconductor pattern LSP is in direct contact with the lower filling insulating layer 40. Top surfaces of the lower semiconductor pattern LSP and the common source region 52 are higher than a top surface of the lowermost electrode EL. In FIG. 20, a bottom surface of the common source region 52 is spaced apart from a bottom surface of the horizontal semiconductor layer 50, and a bottom surface of the lower semiconductor pattern LSP is in direct contact with the lower filling insulating layer 40. A top surface of the common source region 52 is higher than a top surface of the lowermost electrode EL, and a top surface of the lower semiconductor pattern LSP is lower than the top surface of the lowermost electrode EL.

Referring back to FIG. 17, well pickup regions 53 are adjacent to both ends of the cell array structure CS. For example, the well pickup regions 53 are alternately disposed on ends of the stacked structures ST and ends of the common source regions 52. The well pickup regions 53 may be formed by doping impurities of the first conductivity type into the horizontal semiconductor layer 50. As shown in FIG. 18, a bottom surface of the well pickup region 53 is in contact with the lower filling insulating layer 40. The bottom surface of the well pickup region 53 is lower than that of the common source region 52. A well contact plug PPLG is connected to the well pickup region 53 to apply an erase voltage thereto.

The bottom surfaces of the common source regions 52 are spaced apart from the bottom surface of the horizontal semiconductor layer 50. In this case, the common source regions 52 do not block current flow in the second direction D2 in the horizontal semiconductor layer 50. For example, the common source regions 52 do not prohibit holes from flowing in the second direction D2 and under the common source regions 52 in the cell array region CAR when an erase voltage is applied to the horizontal semiconductor layer 50 through the well pickup region 53.

An erase operation of three-dimensional semiconductor memory devices according to an exemplary embodiment of the inventive concept will now be described with reference to FIGS. 21 to 24.

Figure 21:
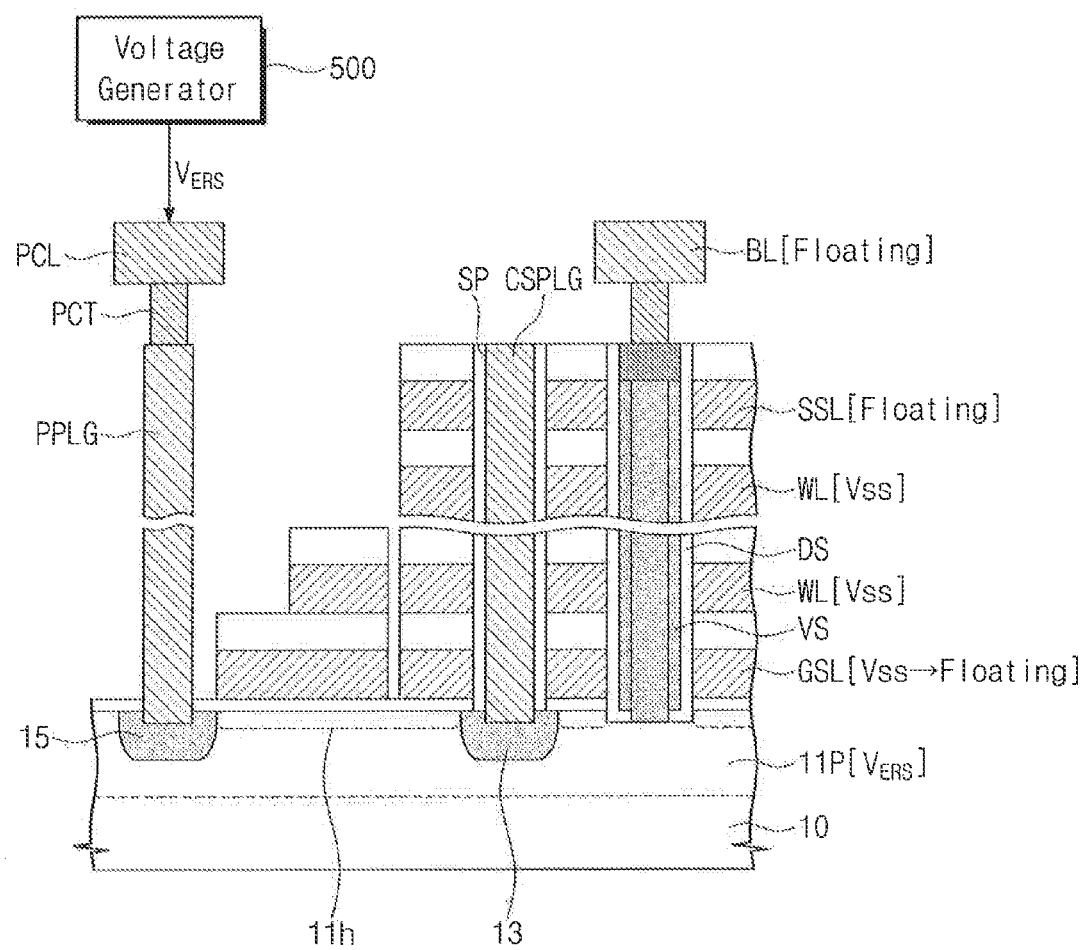
FIG. 21 illustrates an erase operation of a three-dimensional semiconductor memory device according to an exemplary embodiment of the inventive concept.
Figure 22:
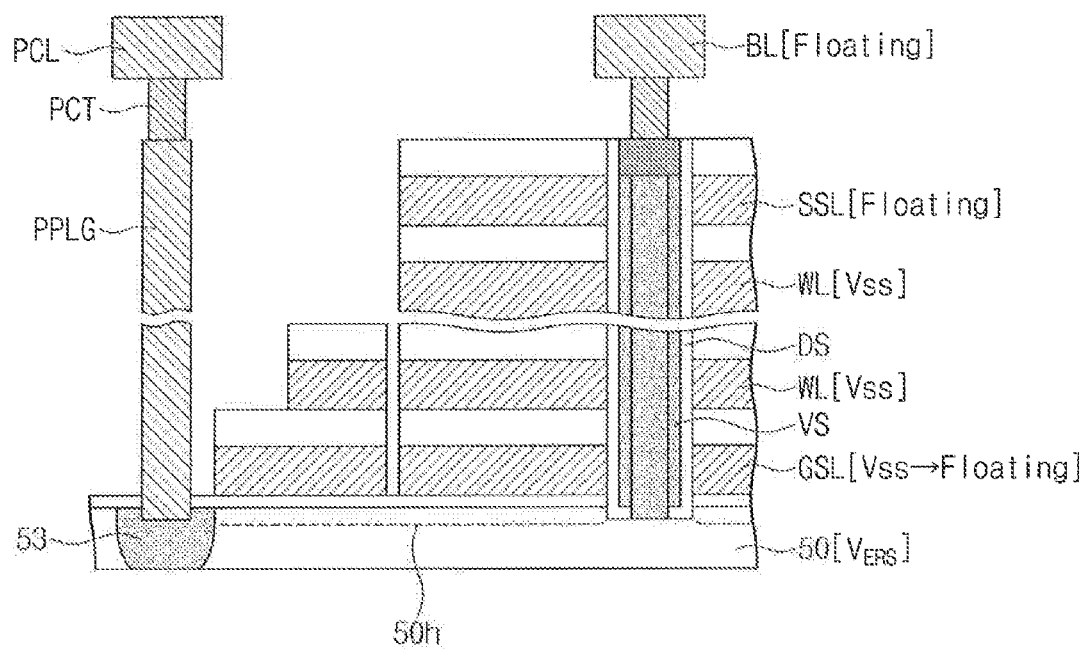
FIG. 22 illustrates an erase operation of a three-dimensional semiconductor memory device according to an exemplary embodiment of the inventive concept.
Figure 23:
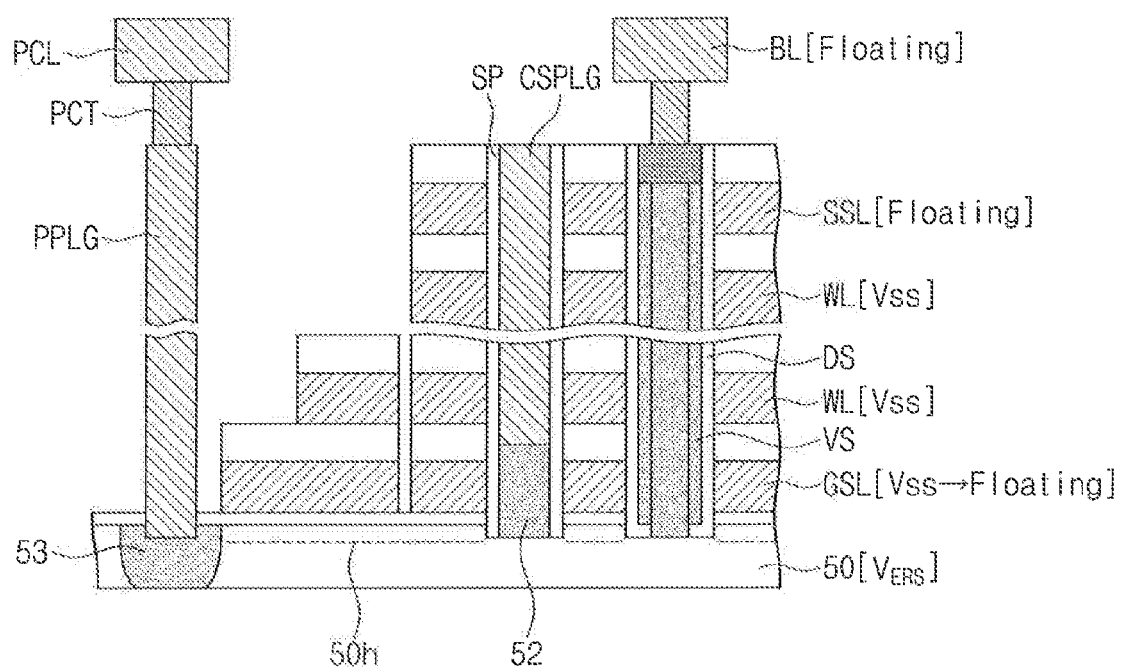
FIG. 23 illustrates an erase operation of a three-dimensional semiconductor memory device according to an exemplary embodiment of the inventive concept.
Figure 24:
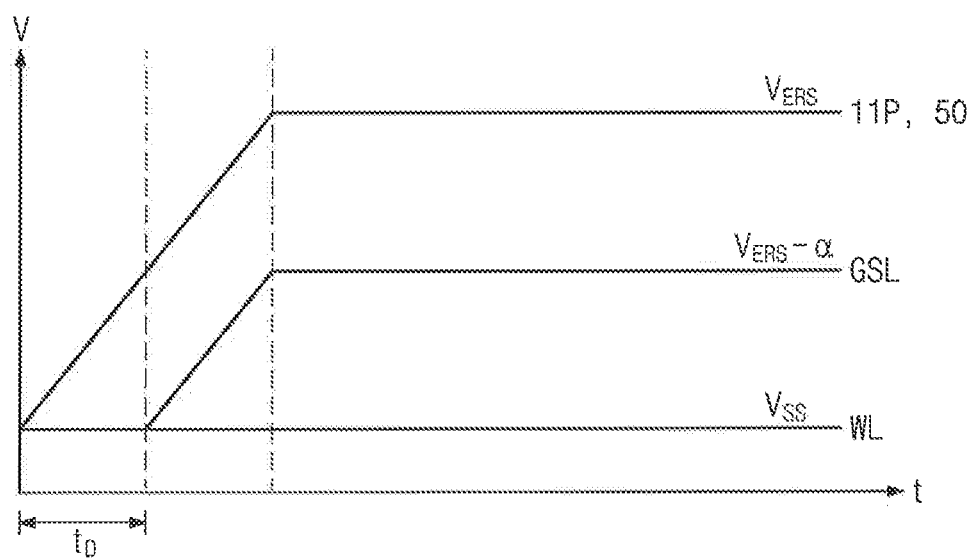
FIG. 24 is a timing diagram illustrating voltage conditions during an erase operation of a three-dimensional semiconductor memory device according to an exemplary embodiment of the inventive concept.

FIGS. 21 to 23 illustrate an erase operation of three-dimensional semiconductor memory devices according to an exemplary embodiment of the inventive concept. FIG. 24 is a timing diagram illustrating voltage conditions during an erase operation of a three-dimensional semiconductor memory device according to an exemplary embodiment of the inventive concept.

Referring to FIGS. 21 and 24, in an erase operation, an erase voltage $V_{ERS}$ is applied to a pocket well impurity layer $11p$ through a well pickup region 15, and a ground voltage VSS is applied to wordlines WL and a ground selection line GSL. The three-dimensional semiconductor memory device further includes a voltage generation circuit 500 that provides the erase voltage $V_{ERS}$ to a pocket impurity layer $11_P$ through a well contact plug PPLG and a well pickup region 15. The ground selection line GSL is electrically floated at a delay time $t_D$ after the erase operation is started. For example, when an erase operation is performed, the ground selection line GSL is first supplied with a ground voltage VSS, and after the delay time $t_D$, the ground selection line GSL is floated. A bit line BL, a string selection line SSL, and a common source region 13 are floated in the erase operation.

When the erase voltage $V_{ERS}$ is applied to the well pickup region 15, a voltage of the pocket well impurity layer $11p$ starts to rise from the ground voltage $V_{SS}$, as shown in FIG. 24. During the delay time tD, the ground voltage $V_{SS}$ is applied to the ground selection line GSL and the erase voltage $V_{ERS}$ is applied to the pocket well impurity layer $11p$ through the well pickup region 15. In this case, holes are accumulated to form a hole accumulation layer $11h$ on an upper surface of the pocket well impurity layer 11. For example, the hole accumulation layer $11h$ is formed underneath the ground selection line GSL.

After the delay time to, the ground selection line GSL is electrically floated. The ground selection line GSL may be electrically coupled to the pocket well impurity layer $11p$ such that a voltage level of the ground selection line GSL starts to increase from the ground voltage $V_{SS}$ to $V_{ERS}$-α that is lower than the erase voltage $V_{ERS}$. Since the vertical structure VS has the same conductivity type as the pocket well impurity layer $11p$, the erase voltage $V_{ERS}$ applied to the pocket well impurity layer $11p$ may be provided to the vertical structure VS after the ground selection line GSL is electrically floated. For example, holes accumulated in the pocket well impurity layer $11p$ may be provided to the vertical structures VS to erase data stored in the data storage layer DS.

As described above, since holes are provided to the vertical structures VS after the hole accumulation layer $11h$ is generated in the vertical semiconductor layer 50, a transfer path of the holes provided to the vertical structures VS may be shortened. For example, since speed of providing the holes to the vertical structure VS during an erase operation may be increased, the erase speed of a three-dimensional nonvolatile memory device may be increased.

Referring to FIGS. 22 and 24, well pickup regions 53 and common source regions 13 may be formed in the horizontal semiconductor layer 50, as described with reference to FIGS. 9, 14, and 16. Depth of the common source regions 13 may be substantially equal to thickness of the horizontal semiconductor layer 50.

During an erase operation, an erase voltage $V_{ERS}$ may be applied to the horizontal semiconductor layer 50 of a first conductivity type through the well pickup region 53 and a ground voltage $V_{SS}$ may be applied to the wordlines WL and the ground selection line GSL. After generating an erase voltage $V_{ERS}$, a voltage generating circuit (not shown) may electrically float the ground selection line GSL after the delay time $t_D$ elapses. A bit line BL, a string selection line SSL, and a common source region may be floated.

When the erase voltage $V_{ERS}$ is applied to the well pickup region 53, a voltage of the horizontal semiconductor layer 50 starts to rise from the ground voltage $V_{SS}$. Since the ground voltage $V_{SS}$ is applied to the ground selection line GSL while the erase voltage $V_{ERS}$ applied to the well pickup region 53 is supplied to the horizontal semiconductor layer 50, holes may be accumulated on an upper surface of the horizontal semiconductor layer 50 below the ground selection line GSL to form a hole accumulation layer $50h$. The vertical structures VS may have the same conductivity type as the horizontal semiconductor layer 50. Therefore, if the ground selection line GSL is electrically floated after the hole accumulation layer 50 is formed, the erase voltage $V_{ERS}$ of the horizontal semiconductor layer 50 may be provided to the vertical structures VS. For example, the holes accumulated in the horizontal semiconductor layer 50 may be provided to the vertical structures VS.

Referring back to FIGS. 8, 9A, 9B and 13 to 16, the depth of the common source regions 51 may be substantially equal to the thickness of the horizontal semiconductor layer 50. The well pickup regions 53 are separated from each other by the common source regions in the second direction D2. Accordingly, the common source regions 51 may prevent holes in the horizontal semiconductor layer 50 from flowing in the second direction D2 from the well pickup regions 53. However, since the well pickup regions 53 are adjacent to both ends of each of the stacked structures VS, the holes may flow in the first direction D1 to the vertical structures VS from the well pickup regions 53. For example, holes may be provided to the vertical structures VS separated by the common source regions 51 during an erase operation. Accordingly, the well pickup regions 53 adjacent to both ends of the stacked structures ST may provide holes to the vertical structures VS to increase erase operation performance.

Referring to FIGS. 17 and 23, the well pickup regions 53 are formed in the horizontal semiconductor layer 50, and a bottom surface of the common source region 52 is spaced apart from a bottom surface of the horizontal semiconductor layer 50. Accordingly, holes supplied from the well pickup regions 53 may flow under the common source region 52 in a second direction D2. Accordingly, the holes may flow through the horizontal semiconductor layer 50 of a cell array region CAR in the second direction D2.

Referring to FIG. 24, in the erase operation, an erase voltage $V_{ERS}$ is applied to the horizontal semiconductor layer 50 of the first conductivity layer through the well pickup region 53, and a ground voltage $V_{SS}$ is applied to wordlines WL and a ground selection line GSL. The ground selection line GSL is electrically floated at a delay time to after the erase operation is started. A bit line BL, a string selection line SSL, and a common source region 52 are floated.

When the erase voltage $V_{ERS}$ is applied to the well pickup region 53, a voltage of the horizontal semiconductor layer 50 starts to rise from the ground voltage $V_{SS}$. Since the ground voltage $V_{SS}$ is applied to the ground selection line GSL while the erase voltage $V_{ERS}$ applied to the well pickup region 53 is supplied to the horizontal semiconductor layer 50, holes may be accumulated on surface of the horizontal semiconductor layer 50 below the ground selection line GSL to form a hole accumulation layer 50h. The vertical structures VS has the same conductivity type as the horizontal semiconductor layer 50. Therefore, if the ground selection line GSL is electrically floated after the hole accumulation layer 50 is formed, the erase voltage $V_{ERS}$ of the horizontal semiconductor layer 50 may be provided to the vertical structures VS. For example, the holes accumulated in the horizontal semiconductor layer 50 may be provided to the vertical structures VS.

In this embodiment, since the common source regions 52 are spaced apart from the bottom surface of the horizontal semiconductor layer 50, the well pickup regions 53 may be disposed without position limitation, as shown in FIG. 17. For example, the holes may flow in the first direction D1 and the second direction D2 in the well pickup regions 53 to be provided to the vertical structures VS during an erase operation.

Figure 25:
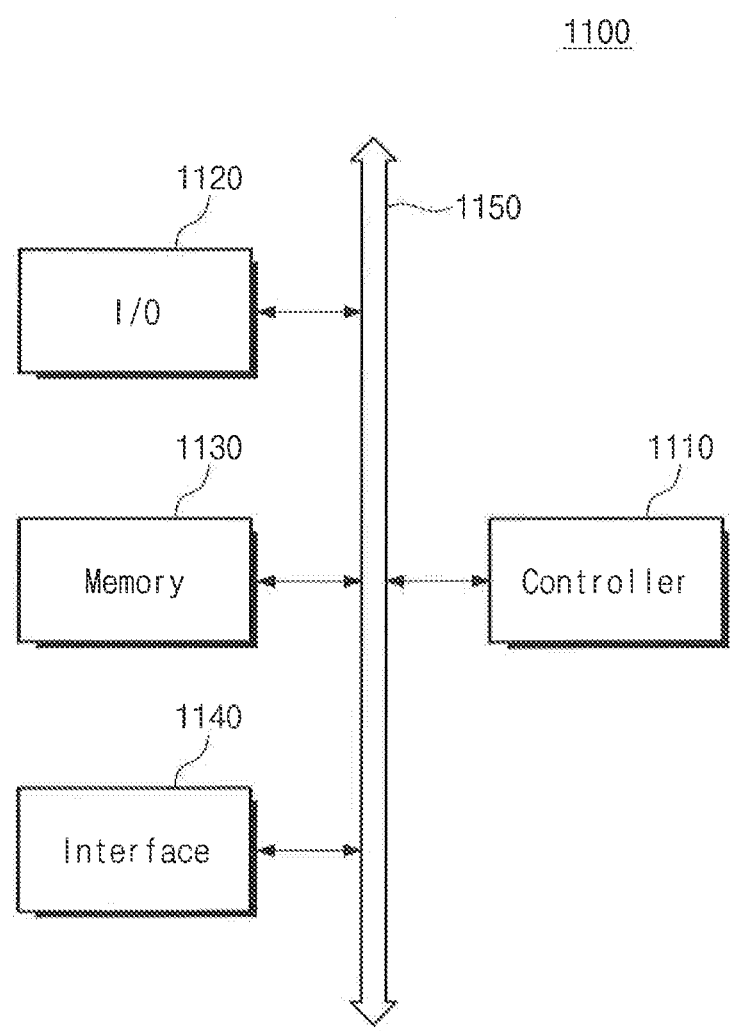
FIG. 25 is an exemplary block diagram illustrating a memory system including a three-dimensional semiconductor memory device according to an exemplary embodiment of the inventive concept.

FIG. 25 is a schematic block diagram illustrating a memory system 1100 including a three-dimensional semiconductor memory device according to an exemplary embodiment of the inventive concept. As illustrated, the memory system 1100 may be applied to personal digital assistants (PDAs), portable computers, web tablets, wireless phones, mobile phones, digital music players, memory cards or all devices capable of transmitting and/or receiving data in wireless environments.

The memory system 1100 includes an input/output device (I/O device) 1120 such as a keypad, a keyboard, and a display device, a memory 1130, an interface 1140, and a bus 1150. The memory 1130 and the interface 1140 communicate with each other through the bus 1150.

The controller 1110 includes at least one of a microprocessor, a digital signal processor, a micro controller, and the other processing devices capable of performing similar functions thereto. The memory 1130 may serve to store commands executed by the controller 1110. The I/O device 1120 may receive data or a signal from the outside of the memory system 1100 or output data or a signal to the outside of the memory system 1100. For example, the I/O device 1120 may include a keyboard, a keypad, and a display device.

The memory 1130 may include a flash memory device according to an exemplary embodiment of the inventive concept. The memory 1130 may further include a different type of memory device, a randomly accessible non-volatile memory device, and various types of memory devices.

The interface 1140 may transmit data to a communication network or receive data from the communication network.

Figure 26:
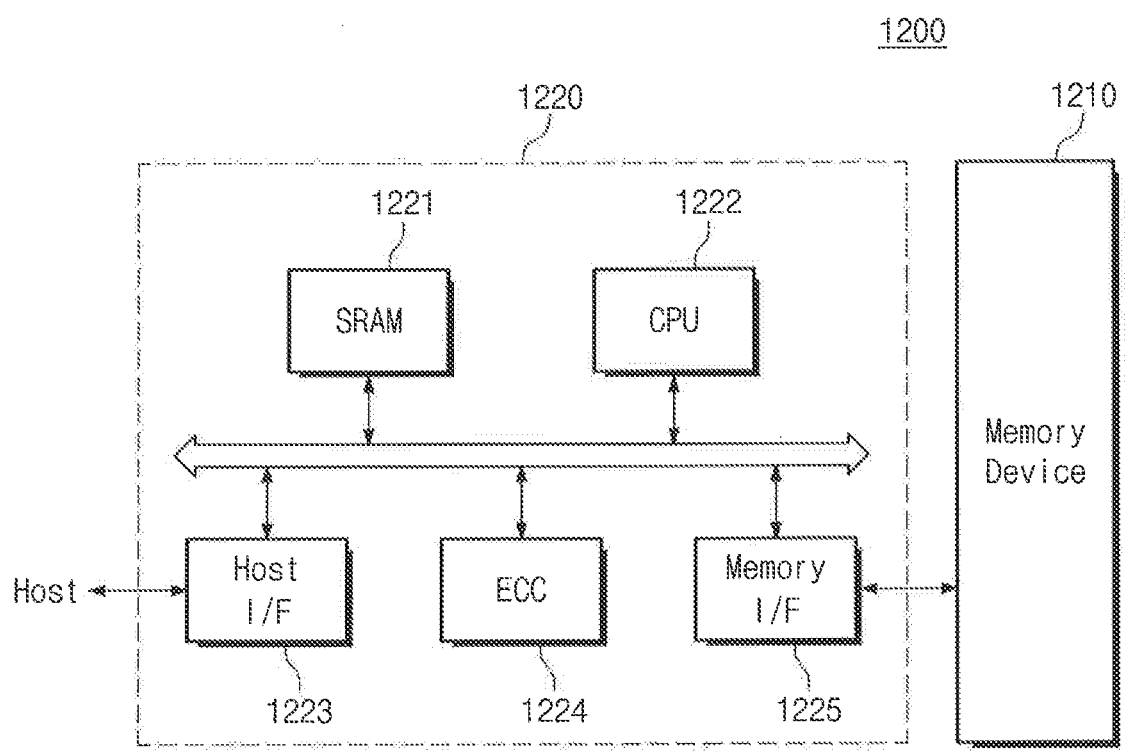
FIG. 26 is an exemplary block diagram illustrating a three-dimensional semiconductor memory device according to an exemplary embodiment of the inventive concept.

FIG. 26 is a schematic block diagram illustrating a memory card 1200 including a three-dimensional semiconductor memory device according to an exemplary embodiment of the inventive concept. The memory card 1200 is provided to support mass data storage capability. As illustrated, a flash memory device 1210 according to an exemplary embodiment of the inventive concept is mounted on the memory card 1200. The memory card 1200 may include a memory controller 1200 configured to control overall data exchange between a host and the flash memory device 1210.

A Static Random Access Memory (SRAM) 1221 may serve as a working memory of a processing unit 1222. Using a data exchange protocol, a host interface (Host I/F) 1223 may communicate with the host connected to the memory card 1200. An error correction code (ECC) block 1224 may detect and correct an error included in data read from the flash memory device 1210. A memory interface (Memory I/F) 1225 may interface with the flash memory device 1210. A processing unit (CPU) 1222 may perform the overall control operation for data exchange of the memory controller 1220. The memory card 1200 may further include a Read Only Memory (ROM) (not shown) storing code data for interfacing with the host.

Figure 27:
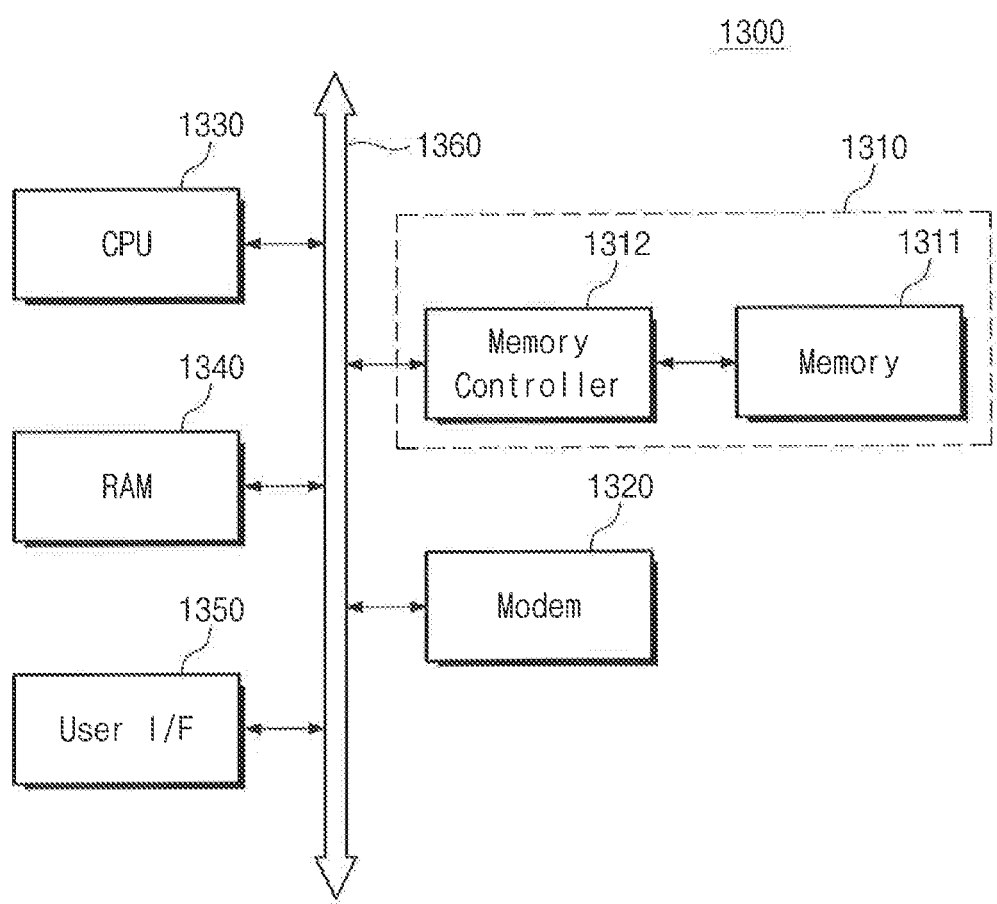
FIG. 27 is an exemplary block diagram illustrating a data processing system including a three-dimensional semiconductor memory device according to an exemplary embodiment of the inventive concept.

FIG. 27 is a schematic block diagram illustrating a data processing system 1300 including a three-dimensional semiconductor memory device according to an exemplary embodiment of the inventive concept. A memory system 1310 according to an exemplary embodiment of the inventive concept is mounted on a data processing system such as a mobile device or a desktop computer. The data processing system 1300 may include the memory system 1310 and a modem 1320, a central processing unit (CPU) 1330, a random access memory (RAM) 1340, and a user interface 1350 that are connected to a system bus 1360. The memory system 1310 may be configured with substantially the same structure as the above-described memory system. Data processed by the CPU 1330 or external input data may be stored in the memory system 1310. The memory system 1310 may be configured using a solid-state disk (SSD). In this case, the data processing system 1300 may store mass data in the memory system 1310. As reliability is increased, the memory system 1310 may save resources consumed in error correction necessary to provide a high-speed data exchange function to the data processing system 1300. The data processing system 1300 may further include an application chipset, a camera image processor (CIS), and an input/output device.

A memory device or a memory system according to an exemplary embodiment of the inventive concept may be packaged in various forms. For example, the memory device or the memory system may be packaged by one of PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP).

According to an exemplary embodiment of the inventive concept, a cell array structure may be disposed on a thin horizontal semiconductor layer. The thin horizontal semiconductor layer may be vertically disposed on a peripheral logic structure. The cell array structure may include stacked structures extending in one direction, and a common source region may be formed in the horizontal semiconductor layer to extend in parallel to the stacked structure between two adjacent stacked structures. Well pickup regions adjacent to both ends of each of the stacked structures may be formed in the horizontal semiconductor layer. Thus, holes supplied from well pickup regions may be supplied to vertical structures from the well pickup regions to increase erase operation performance.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A three-dimensional semiconductor memory device comprising:
    a plurality of stacked structures formed on a semiconductor layer of a first conductivity type, wherein each of the stacked structures includes a plurality of electrodes vertically stacked on each other and is extended in a first direction;
    a plurality of vertical semiconductor patterns penetrating the plurality of stacked structures;
    a plurality of common source regions of a second conductivity type disposed in the semiconductor layer, wherein at least one common source region of the plurality of common source regions is disposed between two adjacent stacked structures of the plurality of stacked structures, and the at least one common source region is extended in the first direction; and
    a plurality of well pickup regions of the first conductivity type disposed in the semiconductor layer,
    wherein at least two well pickup regions of the plurality of well pickup regions are adjacent to both ends of at least one stacked structure of the plurality of stacked structures, and
    wherein the plurality of vertical semiconductor patterns are nearer to the plurality of common source regions than the plurality of immediately adjacent well pickup regions.

2. The three-dimensional semiconductor memory device of claim 1, wherein vertical depths of the at least one common source region and at least one well pickup region are substantially equal to thickness of the semiconductor layer.

3. The three-dimensional semiconductor memory device of claim 1, wherein at least one well pick up region of the plurality of well pickup regions is disposed between two adjacent common source regions of the plurality of common source regions.

4. The three-dimensional semiconductor memory device of claim 1, wherein the plurality of well pick up regions includes at least one well pick up region disposed underneath of the at least one stacked structure.

5. The three-dimensional semiconductor memory device of claim 1, further comprising:
    a peripheral logic structure including a lower filling insulating layer and peripheral circuits,
    wherein the lower filling insulating layer covers the peripheral circuits, and
    wherein the semiconductor layer is disposed on a top surface of the lower filling insulating layer.

6. The three-dimensional semiconductor memory device of claim 5, wherein at least one of the plurality of vertical semiconductor patterns includes a lower semiconductor pattern and an upper semiconductor pattern,
    wherein the lower semiconductor pattern is disposed on a sidewall of a lowermost electrode in the plurality of electrodes, and
    wherein the upper semiconductor pattern is disposed on an upper surface of the lower semiconductor pattern.

7. The three-dimensional semiconductor memory device of claim 6,
    wherein the lower semiconductor pattern penetrates the semiconductor layer to be in contact with the lower filling insulating layer.

8. The three-dimensional semiconductor memory device of claim 5, further comprising:
    a connection contact plug penetrating the semiconductor layer to electrically connect the peripheral logic structure and the plurality of stacked structures to each other.

9. A three-dimensional semiconductor memory device comprising:
    a cell array structure including a plurality of stacked structures extending in parallel to each other on a semiconductor layer of a first conductivity type,
    a plurality of vertical structures penetrating the plurality of stacked structures, and
    a plurality of common source regions of a second conductivity type disposed in the semiconductor layer between the plurality of stacked structures and extending in parallel to the plurality of stacked structures; and
    a plurality of well pickup regions of the first conductivity type spaced apart from each other and disposed in the semiconductor layer surrounding the cell array structure when viewed from a plan view.

10. The three-dimensional semiconductor memory device of claim 9,
    wherein at least one well pick up region of the plurality of well pickup regions includes a bottom surface spaced apart from a bottom surface of the semiconductor layer, and
    wherein at least one common source region of the plurality of common source regions includes a bottom surface spaced apart from the bottom surface of the semiconductor layer.

11. The three-dimensional semiconductor memory device of claim 10,
    wherein the at least one common source region comprises an epitaxial pattern grown from the semiconductor layer.

12. The three-dimensional semiconductor memory device of claim 11, further comprising:
    a sidewall insulating spacer disposed between the epitaxial pattern and at least one of the plurality of stacked structures.

13. The three-dimensional semiconductor memory device of claim 9, further comprising:
    a peripheral logic structure including a lower filling insulating layer and peripheral circuits,
    wherein the lower filling insulating layer covers the peripheral circuits.

14. The three-dimensional semiconductor memory device of claim 13, further comprising:
    a connection contact plug penetrating the semiconductor layer to electrically connect the peripheral logic structure and the cell array structure to each other.

15. The three-dimensional semiconductor memory device of claim 13, wherein at least one vertical semiconductor pattern of the plurality of vertical semiconductor patterns includes a lower semiconductor pattern and an upper semiconductor pattern,
    wherein the lower semiconductor pattern is disposed on a sidewall of a lowermost electrode in the plurality of electrodes, and
    wherein the upper semiconductor pattern is disposed on an upper surface of the lower semiconductor pattern.

16. A three-dimensional semiconductor memory device comprising:
- a voltage generator configured to generate an erase voltage;
- a plurality of stacked structures disposed on a semiconductor layer of a first conductivity type, wherein each of the stacked structures includes a plurality of electrodes vertically stacked on each other and is extended in a first direction; a plurality of common source regions of a second conductivity type disposed in the semiconductor layer, wherein at least one common source region of the plurality of common source regions is disposed between two adjacent stacked structures of the plurality of stacked structures, and the at least one common source region is extended in the first direction; and
- a plurality of well pickup regions of the first conductivity type disposed in the semiconductor layer,
- wherein at least two well pickup regions of the plurality of well pickup regions are adjacent to both ends of at least one stacked structure of the plurality of stacked structures, and
- wherein the at least two well pickup regions are electrically connected to the voltage generator to receive the erase voltage during an erase operation, and
- wherein the plurality of well pickup regions are spaced apart from each other and are arranged to surround the plurality of stacked structures when viewed from a plan view.

17. The three-dimensional semiconductor memory device of claim 16,
- wherein the plurality of common source regions is electrically connected to a ground voltage during a read or program operation of the three-dimensional semiconductor memory device.

18. The three-dimensional semiconductor memory device of claim 16,
- wherein an impurity of the first conductivity is doped in the semiconductor layer and the plurality of well pickup regions at a first concentration and a second concentration, respectively, and
- wherein the second concentration is greater than the first concentration.

19. The three-dimensional semiconductor memory device of claim 16,
- wherein the at least one common source region is further extended underneath the both ends of the at least one stacked structure.

20. The three-dimensional semiconductor memory device of claim 16,
- wherein the plurality of well pickup regions includes at least two well pickup regions adjacent to both ends of at least one common source region.

* * * * *